(12) United States Patent
Teeter et al.

(10) Patent No.: US 11,343,936 B2
(45) Date of Patent: May 24, 2022

(54) RACK SWITCH COUPLING SYSTEM

(71) Applicant: Dell Products L.P., Round Rock, TX (US)

(72) Inventors: Victor Teeter, Round Rock, TX (US); Shree Rathinasamy, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 156 days.

(21) Appl. No.: 16/775,189

(22) Filed: Jan. 28, 2020

(65) Prior Publication Data

US 2021/0235594 A1  Jul. 29, 2021

(51) Int. Cl.
  *H05K 7/14*  (2006.01)
(52) U.S. Cl.
  CPC ......... *H05K 7/1491* (2013.01); *H05K 7/1492* (2013.01)
(58) Field of Classification Search
  None
  See application file for complete search history.

(56) References Cited

U.S. PATENT DOCUMENTS

| | | | |
|---|---|---|---|
| 2005/0050272 A1* | 3/2005 | Behrens | G06F 1/189 |
| | | | 711/114 |
| 2007/0025271 A1* | 2/2007 | Niedrich | G06F 1/20 |
| | | | 370/254 |
| 2008/0186667 A1* | 8/2008 | Verdiell | H05K 7/1492 |
| | | | 361/679.4 |
| 2015/0253821 A1* | 9/2015 | Palmer | G06F 1/189 |
| | | | 361/679.31 |
| 2017/0257970 A1* | 9/2017 | Alleman | G06F 1/184 |
| 2020/0163242 A1* | 5/2020 | Leigh | H05K 5/0204 |
| 2021/0044094 A1* | 2/2021 | Lawrence | H05K 7/1491 |

* cited by examiner

*Primary Examiner* — Rockshana D Chowdhury
*Assistant Examiner* — Christopher L Augustin
(74) *Attorney, Agent, or Firm* — Joseph Mencher

(57) ABSTRACT

A rack switch coupling system includes a switch device and a plurality of computing devices that are positioned in a rack in a stacked orientation. Each of the computing devices includes a top surface that corresponds with a first plane associated with that computing device, and a bottom surface that corresponds with a second plane associated with that computing device. A port extender system is positioned in the rack and includes respective first ports cabled to each of the computing devices, with each of the respective first ports located adjacent the computing device to which it is cabled and between the first plane and the second plane associated with that computing device. The port extender device also includes a plurality of second ports that are each located adjacent and cabled to switch device, with each respective first port connected to one of the plurality of second ports.

20 Claims, 24 Drawing Sheets

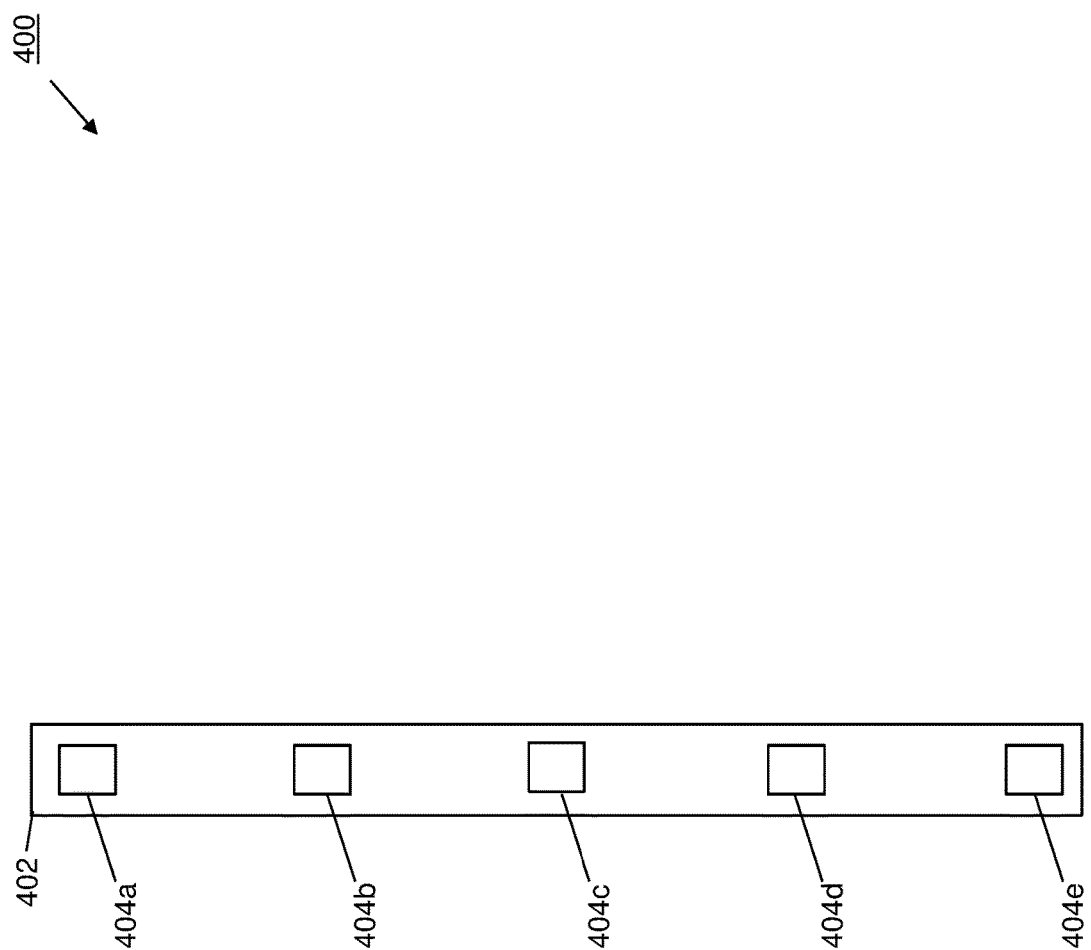

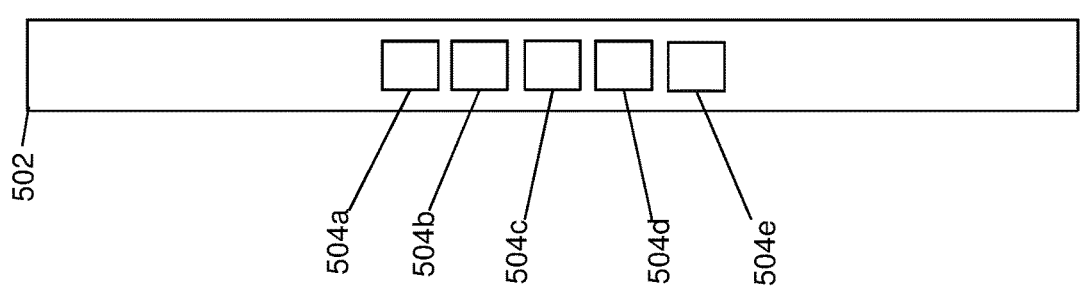

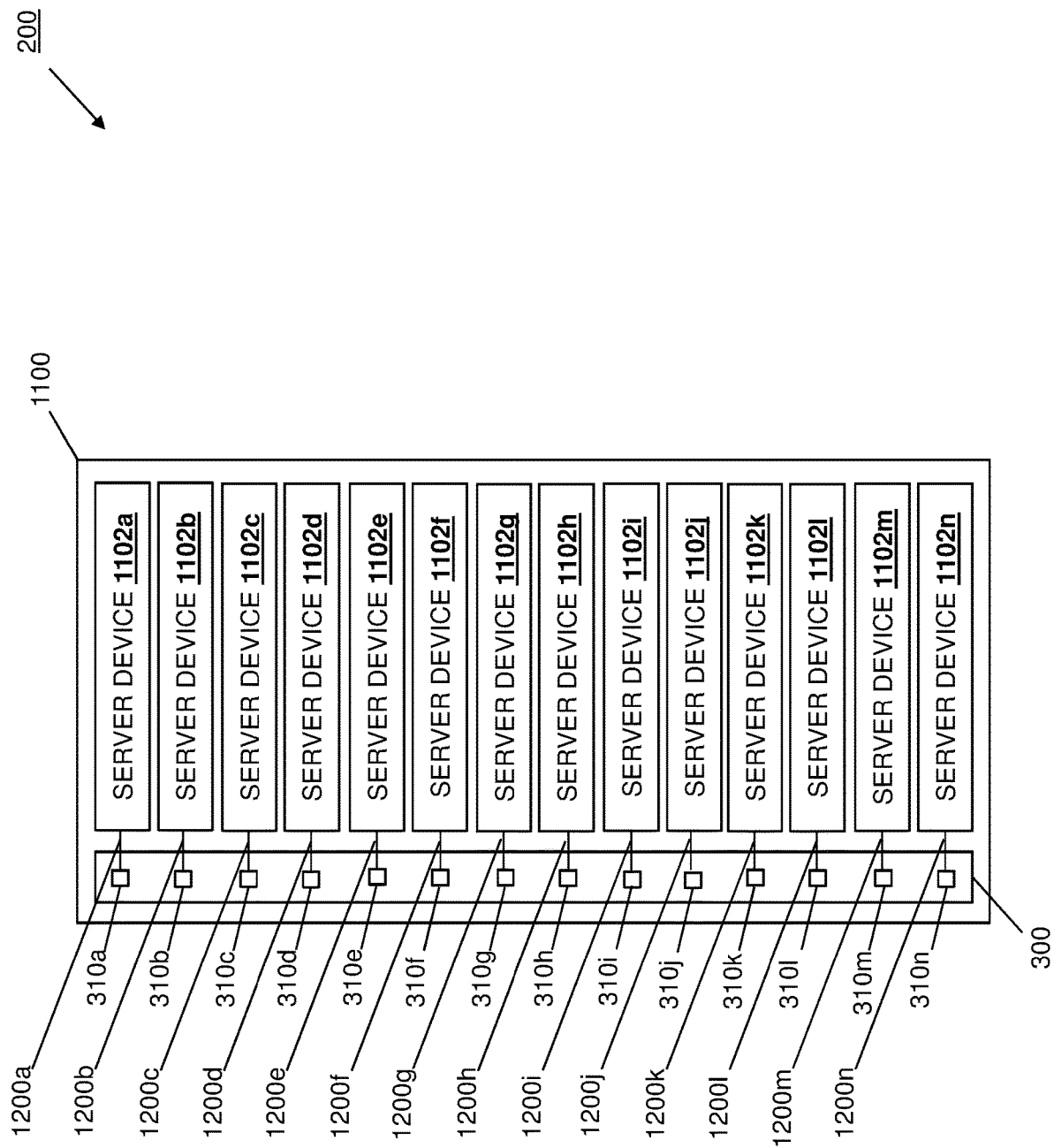

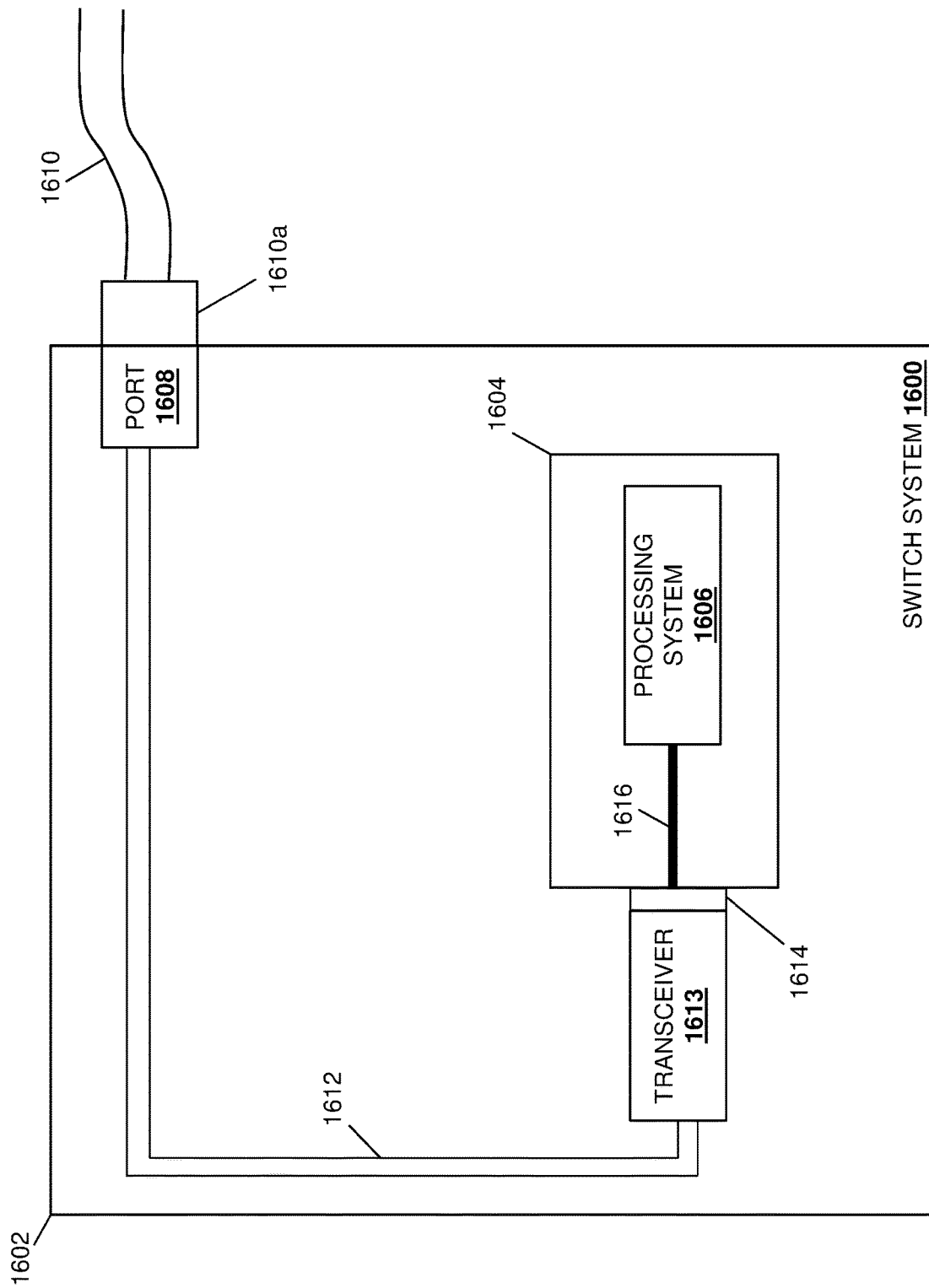

RACK SWITCH COUPLING SYSTEM

BACKGROUND

The present disclosure relates generally to information handling systems, and more particularly to coupling information handling systems to a switch in an information handling system rack.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, storage systems, and/or other computing devices, are often provided in a rack and coupled to each other and a network using one or more switch devices that are also provided in that rack. The coupling of computing devices to switch devices in a rack is accomplished via respective cables coupled between respective ports on the switch device(s) and respective ports on the computing devices, and one of skill in the art in possession of the present disclosure will recognize that as racks hold more and more computing devices, more and more cables may be utilized with that rack to provide those couplings. For example, in conventional racks that hold 4 switch devices positioned adjacent the top of the rack (i.e., Top of Rack (ToR) switch devices) and more than 40 computing devices positioned below those switch devices, upward of 160 separate cables may be utilized to couple the switch devices with those computing devices. In order to ensure efficient access to the computing devices and switch devices, cable management techniques are utilized that typically route the cables between the switch devices and the computing devices along one or more sides of the rack in a group or "bunch".

Such cable management techniques typically include the utilization of cable management/routing hardware, as well as the design and planning of cable routing strategies involving different length cables that allow the routing of any particular cable between a switch device and any particular computing device without providing that cable with a length that exceeds the cable routing distance (i.e., cable "slack" that must then be managed in some manner.) As such, cables utilized in the rack can be up to 2-3 feet longer than the shortest distance between the switch device and computing device they couple together in order to provide the desired cable routing path, which can result in relatively long cables being required for at least some of the computing devices provided in the rack. As will be appreciated by one of skill in the art in possession of the present disclosure, the conventional coupling and cable management techniques discussed above provide cabling that can obstruct airflow, activity indicator LEDs, and text on the computing devices, while making it cumbersome to add and remove cables to and from the rack due to the need to plan for and provide the cable routing discussed above. Furthermore, tracing any particular cable between a switch device and a computing device is difficult due to that cable being "bunched" or otherwise routed in a group of cables that run along a side of the rack, with the cabling between a switch device and computing devices that are positioned near the bottom of the rack (i.e., opposite the rack from that switch device) presenting particular cable tracing difficulties.

Accordingly, it would be desirable to provide a rack switch coupling system that addresses the issues discussed above.

SUMMARY

According to one embodiment, an Information Handling System (IHS) includes at least one chassis is configured to be positioned in a rack including a switch device and a plurality of computing devices in a stacked orientation; and a communication system that is located in the at least one chassis and that includes: respective first ports that are each configured to be cabled to the plurality of computing devices when the at least one chassis is positioned in the rack, with each of the respective first ports located adjacent the computing device to which it is cabled and between a first plane corresponding to a top surface of that computing device and a second plane corresponding to a bottom surface of that computing device that is opposite the top surface; and a plurality of second ports that are each configured to each located adjacent to the switch device and cabled to the switch device when the at least one chassis is positioned in the rack, wherein each respective first port is connected to one of the plurality of second ports.

BRIEF DESCRIPTION OF THE DRAWINGS

FIG. 4 is a schematic view illustrating an embodiment of a switch system that may provide the rack switch coupling system of the present disclosure.

FIG. 5 is a schematic view illustrating an embodiment of a switch system that may provide the rack switch coupling system of the present disclosure.

FIG. 12A is a schematic view illustrating an embodiment of the switch system of FIGS. 3A and 3B coupled to server devices in a rack during the method of FIG. 10 to provide the rack switch coupling system of the present disclosure.

FIG. 16 is a schematic view illustrating an embodiment of a switch system that may provide the rack switch coupling system of the present disclosure.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
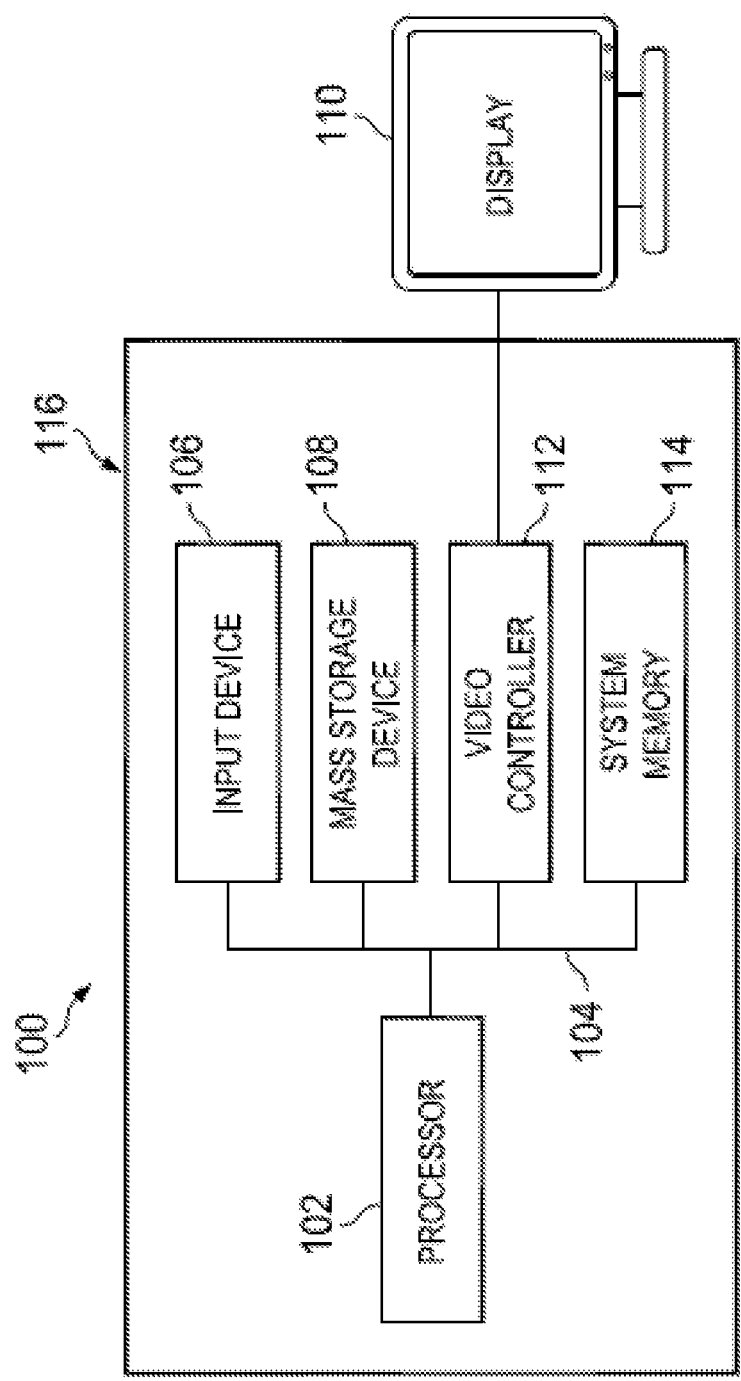
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
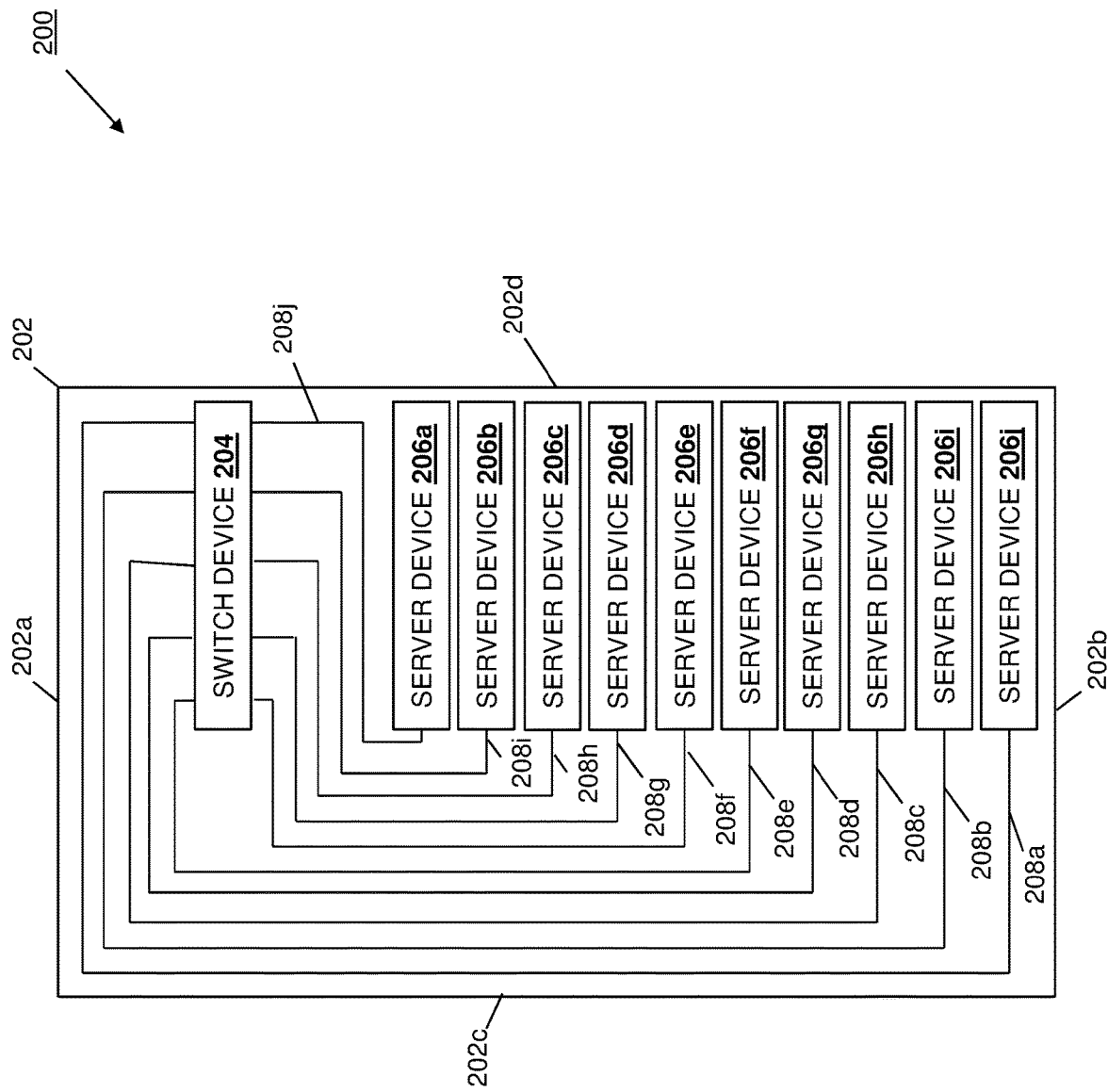
FIG. 2 is a schematic view illustrating an embodiment of a conventional rack switch coupling system.

Referring now to FIG. 2, an embodiment of a conventional rack switch coupling system 200 is illustrated for purposes of discussion of some of the benefits of the rack switch coupling system of the present disclosure. As illustrated in FIG. 2, the conventional rack switch coupling system 200 may include a rack 202 having a top wall 202a, a bottom wall 202b that is located opposite the rack 202 from the top wall, and a pair of opposing side walls 202c and 202d that extends between the top wall 202a and the bottom wall 202b. As would be understood by one of skill in the art in possession of the present disclosure, the top wall 202a, the bottom wall 202b, and the side walls 202c and 202d of the rack 202 may define a device housing between them, and the device housing illustrated FIG. 2 is not illustrated to scale in order to allow for an embodiment of a conventional cable routing technique to be clearly depicted. For example, FIG. 2 illustrates the device housing provided by the rack 202 housing a switch device 204 and a plurality of server devices 206a, 206b, 206c, 206d, 206e, 206f, 206g, 206h, 206i, and 206j in a stacked orientation (i.e., with the switch device 204 positioned adjacent the top wall 202a of the rack 202, the server device 206a positioned adjacent and below the switch device 204, the server device 206a positioned adjacent and below the server device 206b, and up to the server device 206j positioned adjacent the bottom wall 202j of the rack 202), and one of skill in the art in possession of the present disclosure will appreciate that the switch device 204 and server devices 206a-206j typically span the width of the rack 202 (e.g., from the side wall 202c to the side wall 202d), rather than the rack providing the additional space in the device housing that is illustrated in FIG. 2 as including cabling, discussed below.

As illustrated in FIG. 2, the conventional rack switch coupling system 200 couples each of the server devices 206a-j to the switch device 204 via at least one respective cable (e.g., one or more cables 208a connected to ports on the server device 206a and the switch device 204, one or more cables 208b connected to ports on the server device 206b and the switch device 204, one or more cables 208c connected to ports on the server device 206c and the switch device 204, one or more cables 208d connected to ports on the server device 206d and the switch device 204, one or more cables 208e connected to ports on the server device 206e and the switch device 204, one or more cables 208f connected to ports on the server device 206f and the switch device 204, one or more cables 208g connected to ports on the server device 206g and the switch device 204, one or more cables 208h connected to ports on the server device 206h and the switch device 204, one or more cables 208i connected to ports on the server device 206i and the switch device 204, and one or more cables 208j connected to ports on the server device 206j and the switch device 204.) Furthermore, as illustrated in FIG. 2, each of those cables 208a-208j may be routed from the port on the server device to which it is connected and to the side wall 202c, then adjacent to and along the side wall 202c towards the top wall 202a, and then back towards the port on the switch device 204 to which it is connected. Furthermore, the portions of the cables that are routed along the side wall 202c may be bundled together using a variety of cable management hardware.

As discussed above, conventional rack switch coupling systems like that illustrated in FIG. 2 require the design and planning of cable routing strategies involving different length cables that allow the routing of any particular cable between the switch device and any of the server devices 206a-206j without providing that cable with a length or "slack" that exceeds the cable routing distance and that then must be managed in some manner (e.g., the cable(s) 208j connecting the server device 206a to the switch device 204 are relatively much shorter than the cable(s) 208a connecting the server device 206j to the switch device 204) As such, the cables 208a-208j utilized in the rack 200 can be up to 2-3 feet longer than the shortest distance between the switch device and server device they couple together in order to provide the cable routing path along the side wall 202c, which can result in relatively long cables 208a being required for the server devices (e.g., the server device 206j) provided in the rack 200 adjacent its bottom wall 202b. As will be appreciated by one of skill in the art in possession of the present disclosure, the conventional coupling and cable management techniques illustrated in FIG. 2 make it cumbersome to add and remove cables to and from the rack 202 due to the need to plan for and provide the cable routing discussed above, and tracing any particular cable between a switch device and a server device is difficult due to that cable being "bunched" or otherwise routed in the group of cables that run along the side wall 202c of the rack 202, with the cabling 208a between the switch device 204 and server device 206j positioned near the bottom wall 202b of the rack 202 (i.e., opposite the rack 202 from the switch device 204) presenting particular cable tracing difficulties.

Figure 3A:
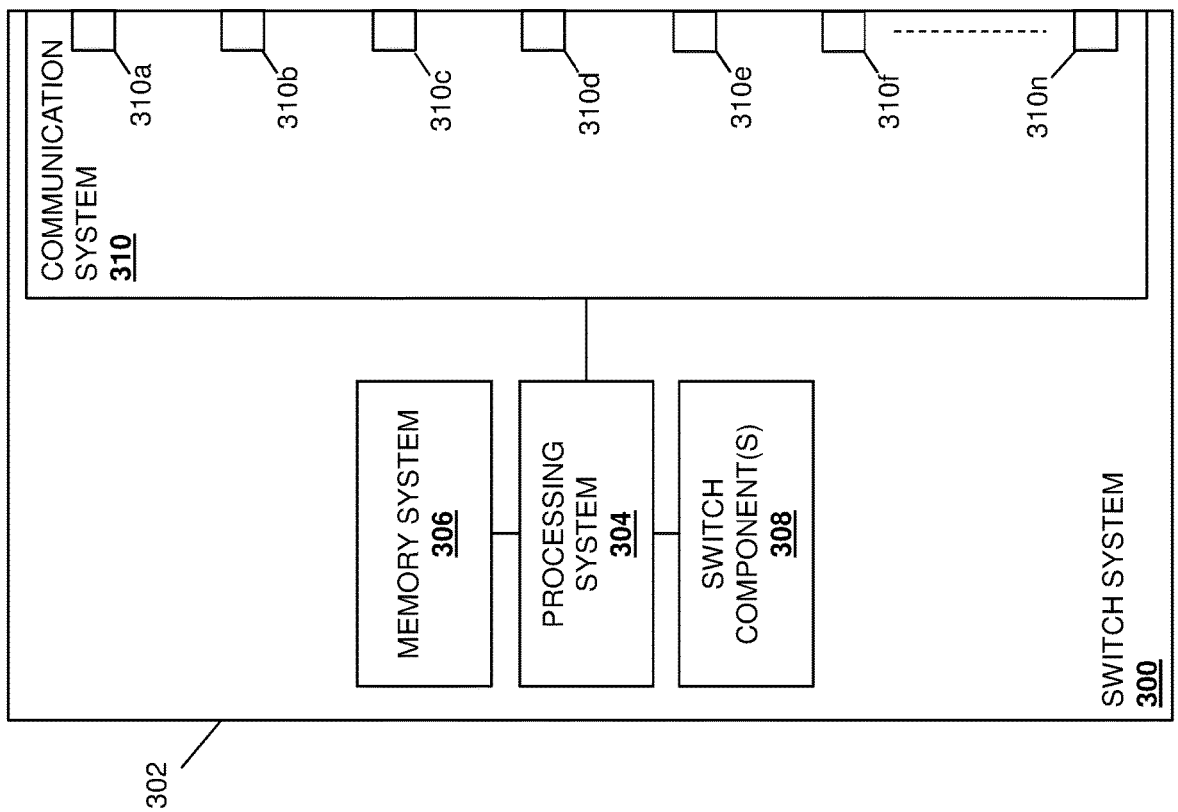
FIG. 3A is a schematic view illustrating an embodiment of a switch system that may provide the rack switch coupling system of the present disclosure.
Figure 3B:
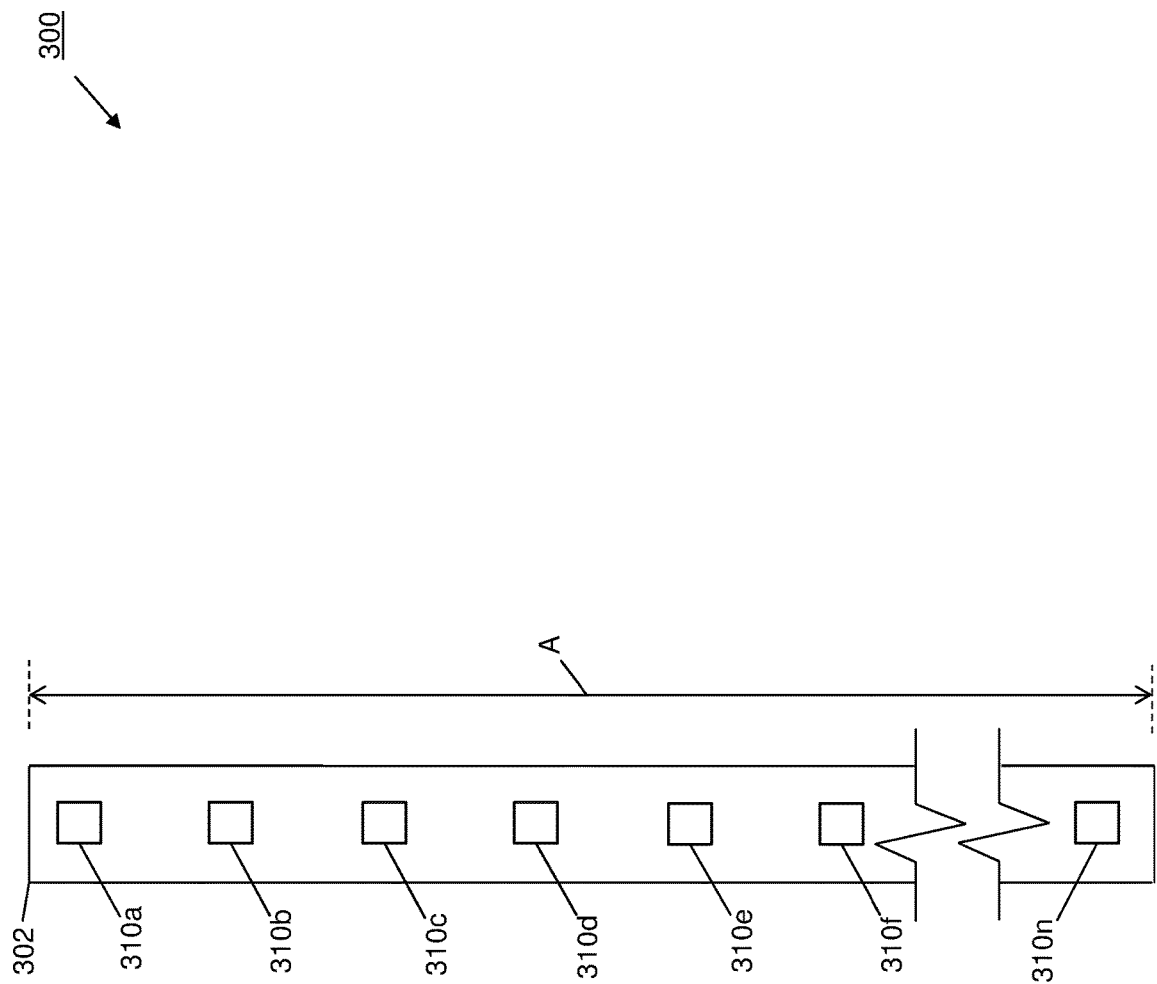
FIG. 3B is a schematic view illustrating an embodiment of the switch system of FIG. 3A.

Referring now to FIGS. 3A and 3B, an embodiment of a switch system 300 is illustrated that may provide the rack switch coupling system of the present disclosure. As such, the switch system 300 may be provided by the IHS 100 discussed above with reference to FIG. 1 and/or may include some or all of the components of the IHS 100, and in specific examples, may provide any of a variety of switching functionality that would be apparent to one of skill in the art in possession of the present disclosure. However, while illustrated and discussed as a switch system providing switching functionality, one of skill in the art in possession of the present disclosure will recognize that the functionality of the switch system 300 discussed below may be provided by other devices that are configured to operate similarly as the switch system 300 discussed below. In the illustrated embodiment, the switch system 300 includes a chassis 302 that houses or supports the components of the switch system 300, only some of which are illustrated and discussed below. In some examples, the chassis 302 may include a plurality of chassis walls that define a chassis enclosure that houses the components of the switch system 300. However, in other examples, the chassis 302 may include a circuit board (e.g., a motherboard) that supports the components of the switch system 300. Furthermore, as discussed below, the chassis 302 may include structures that support modular switch devices that include the components of the switch system 300. As such, one of skill in the art in possession of the present disclosure will appreciate that the chassis 302 of the switch system 300 may be provided in a variety of manners that will fall within the scope of the present disclosure as well.

For example, the chassis 302 may house or support a processing system 304 (e.g., one or more of the processors 102 discussed above with reference to FIG. 1, one or more Application Specific Integrated Circuits (ASICs), one or more Field Programmable Gate Arrays (FPGAs), one or more Complex Programmable Logic Devices (CPLDs), timing modules, switching fabrics, and/or other processing systems components that would be apparent to one of skill in the art in possession of the present disclosure.) The chassis 302 may also house or support a memory system 306 (e.g., one or more flash memory devices, one or more Dynamic Random Access Memory (DRAM) devices, and/or other memory system components that would be apparent to one of skill in the art in possession of the present disclosure) that is coupled to the processing system 304 and that may include instructions that, when executed by the processing system 304, cause the processing system 304 to perform the switching operations and/or other functionality of the switching systems discussed below. As illustrated in FIG. 3A, the switch system 300 may also house or support one or more other switch component(s) 308 that may include fans or other air moving devices, storage systems, PHYsical layer devices (PHYs), and/or other switch components that would be apparent to one of skill in the art in possession of the present disclosure.

The chassis 302 may also house or support a communication system 310 that is coupled to the processing system 304 and that may be provided by a Network Interface Controller (NIC), wireless communication systems (e.g., BLUETOOTH®, Near Field Communication (NFC) components, WiFi components, etc.), and/or any other communication components that would be apparent to one of skill in the art in possession of the present disclosure. As such, the communication system 310 may include a plurality of ports 310a, 310b, 310c, 310d, 310e, 310f, and up to 310n. As illustrated in FIG. 3B, the ports 310a-310n may be positioned along a height A of the chassis 302 in a spaced-apart, stacked orientation relative to each other, with the height A provided as approximately equal to the height of a rack (e.g., the rack 202 illustrated in FIG. 2) in which the switch system 300 will be used, and the spacing and location of the ports 310a-310n provided such that each respective port is located adjacent a corresponding server device (e.g., the server devices 206a-206j) in the rack in which the switch system 300 will be used. However, as discussed below, the switch system 300 illustrated in FIGS. 3A and 3B may include a chassis that extends only along a portion of a height the rack in which it will be used (e.g., along half of the height of that rack, along one-third of the height of that rack, along a quarter of the height of that rack, etc.) while remaining with the scope of the present disclosure as well. Furthermore, while a specific switch system 300 has been illustrated, one of skill in the art in possession of the present disclosure will recognize that switch systems (or other devices and/or systems operating according to the teachings of the present disclosure in a manner similar to that described below for the switch system 300) may include a variety of components and/or component configurations for providing conventional switching device functionality, as well as the functionality discussed below, while remaining within the scope of the present disclosure as well.

Referring now to FIG. 4, a switch system 400 providing one configuration of the switch system of the present disclosure is illustrated. As such, the switch system 400 may be provided by the switch system 300 discussed above with reference to FIGS. 3A and 3B, and/or may include some or all of the components of the switch system 300. As such, the switch system 400 includes a chassis 402 that may be substantially similar to the chassis 302 discussed above with reference to FIGS. 3A and 3B. The embodiment of the switch system illustrated in FIG. 4 illustrates how switch system components 404a, 404b, 404c, 404d, and up to 404e (e.g., processing systems such as ASICs, switching fabrics, timing modules, FPGAs, CPLDs, etc.; memory systems such as flash memory devices, DRAM devices, etc.; and/or other switch components known in the art) may be provided in and/or on the chassis 402 in a linear, distributed configuration that allows the switch system 400 to span the height of the rack in which it will be used.

As such, in some examples, processing system components included in the switch system 400 such as switching ASICs may be positioned in a distributed orientation on the chassis 402. For example, in a switch system 400 that includes a single switching ASIC, that switching ASIC may be substantially centrally located on the chassis 402 (e.g., as illustrated for switch system component 404c in FIG. 4.) However, in a switch system with two switching ASICs, a first switching ASIC may be located one-quarter along the height of the chassis 402 (e.g., as illustrated for switch system component 404b in FIG. 4), and a second switching ASIC may be located three-quarters along the height of the chassis 402 (e.g., as illustrated for switch system component 404d in FIG. 4). Furthermore, FPGA's, CPLDs, switching fabrics, timing modules, flash devices, DRAM devices, and/or other switch components may be distributed along the height of the chassis 402 in any manner that allows for the switching functionality described herein, and one of skill in the art in possession of the present disclosure will appreciate that fan device placement in the chassis 402 of the switch system 400 may be optimized by positioning those fan devices immediately adjacent the switch components that need cooling (e.g., the ASIC(s) discussed above), rather than having those fan devices provide airflow over several switch components that heat that airflow prior to it reaching the switch component(s) that are most in need of cooling (as is done in conventional switch systems.) As will be appreciated by one of skill in the art in possession of the present disclosure, the communication system and its ports (e.g., similar to the communication system 310 and ports 310a-310n discussed above with reference to FIG. 3) are not illustrated in FIG. 4, but may be positioned along a height of the chassis 402 in a spaced-apart, stacked orientation relative to each other in substantially the same manner as discussed above with reference to FIGS. 3A and 3B and, as discussed below, the teachings of the present disclosure may be utilized to couple the switching components 404a-404e to ports 310a-310n (e.g., particularly for ports that are relatively far away from the switch components on the chassis 402.)

Referring now to FIG. 5, a switch system 500 providing one configuration of the switch system of the present disclosure is illustrated. As such, the switch system 500 may be provided by the switch system 300 discussed above with reference to FIGS. 3A and 3B, and/or may include some or all of the components of the switch system 300. As such, the switch system 500 includes a chassis 502 that may be substantially similar to the chassis 302 discussed above with reference to FIGS. 3A and 3B. The embodiment of the switch system illustrated in FIG. 5 illustrates how switch system components 504a, 504b, 504c, 504d, and up to 504e (e.g., processing systems such as ASICs, switching fabrics, timing modules, FPGAs, CPLDs, etc.; memory systems such as flash memory devices, DRAM devices, etc.; and/or other switch components known in the art) may be provided in and/or on the chassis 502 in a centralized configuration that allows the switch system 500 to span the height of the rack in which it will be used.

As such, in some examples, processing system components included in the switch system 500 such as switching ASICs may be positioned in a centralized orientation on the chassis 502 and relatively close to each other. Furthermore, FPGA's, CPLDs, switching fabrics, timing modules, flash devices, DRAM devices, and/or other switch components may be positioned in the centralized orientation on the chassis 402 and relatively closely to each other in any manner that allows for the switching functionality described herein. As will be appreciated by one of skill in the art in possession of the present disclosure, the communication system and its ports (e.g., similar to the communication system 310 and ports 310a-310n discussed above with reference to FIG. 3) are not illustrated in FIG. 4, but may be positioned along a height of the chassis 402 in a spaced-apart, stacked orientation relative to each other in substantially the same manner as discussed above with reference to FIGS. 3A and 3B and, as discussed below, the teachings of the present disclosure may be utilized to couple the switching components 504a-504e to ports 310a-310n (e.g., particularly for ports that are relatively far away from the switch components on the chassis 402.) As will be appreciated by one of skill in the art in possession of the present disclosure, combinations of the distributed and centralized switch component configurations discussed above with reference to FIGS. 4 and 5 may be provided in the switch system of the present disclosure while remaining within the scope of the present disclosure as well.

Figure 6:
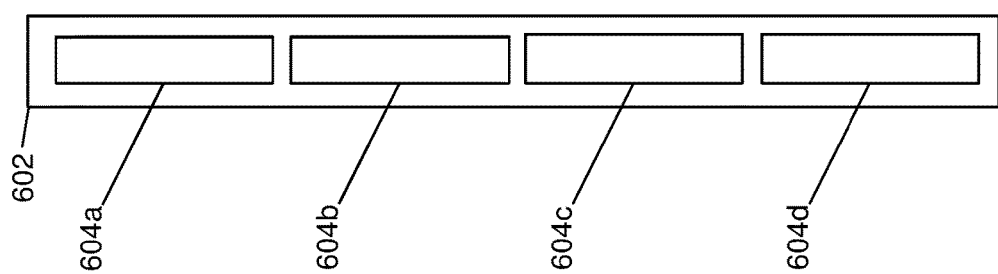
FIG. 6 is a schematic view illustrating an embodiment of a switch system that may provide the rack switch coupling system of the present disclosure.

Referring now to FIG. 6, a switch system chassis 600 is illustrated that may provide for a modular configuration of the switch system of the present disclosure. As such, the switch system chassis 600 may be utilized with multiple switch systems 300 discussed above with reference to FIGS. 3A and 3B. For example, the switch system chassis 600 includes a base 602 that defines a plurality of modular switch device housings 604a, 604b, 604c, and up to 604d, each of which may be configured to house a modular switch device that may be provided by embodiments of the switch system 300 discussed above with reference to FIGS. 3A and 3B. The embodiment of the switch system chassis 600 illustrated in FIG. 6 illustrates how a switch system chassis may be provided that houses multiple modular switch devices that each may include a communication system and its ports (e.g., similar to the communication system 310 and ports 310a-310n discussed above with reference to FIG. 3) that, when the module switch devices are positioned in the respective modular switch device housings 604a-604d, are positioned along a height of the base 602 in a spaced-apart, stacked orientation relative to each other in substantially the same manner as discussed above with reference to FIGS. 3A and 3B.

As such, multiple modular switch devices (i.e., multiple switch systems 300 that each include a height that spans some portion of the height of the rack they will be used in) may be stacked using the switch system chassis 600, and in some embodiments may include modular switch devices with the same capabilities/functionality, while in other embodiments may include different capabilities/functionality (e.g., modular switch devices provided according to the Institute of Electrical and Electronics Engineers (IEEE) 802.3an-2006 standard (10GBASE-T), modular switch devices provided according to the IEEE 802.3ab standard (1000BASE-T), modular switch devices with switch expander ports, modular switch devices with Small Form-factor Pluggable (SFP/SFP+) capabilities/functionality, etc.) Thus, one of skill in the art in possession of the present disclosure will appreciate that, in some embodiments, the switch system chassis 600 may include couplings and/or connections between the modular switch devices housings 604a-604d (e.g., via a backplane in the switch system chassis 600) that may allow the modular switch devices provided therein to communication with each other.

Figure 7:
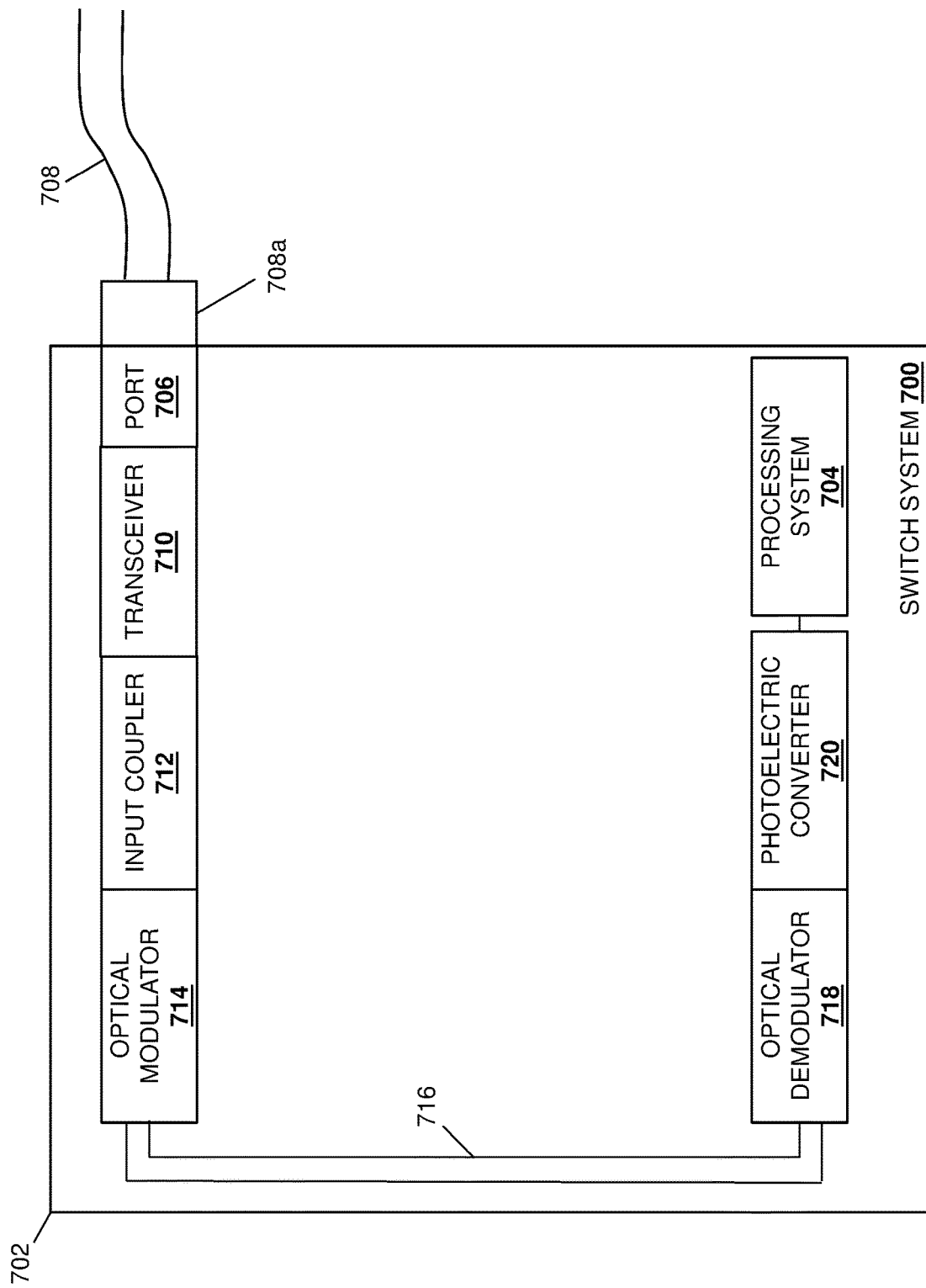
FIG. 7 is a schematic view illustrating an embodiment of a switch system that may provide the rack switch coupling system of the present disclosure.

Referring now to FIG. 7, an embodiment of a switch system 700 is illustrated that includes processing system/port coupling features that may be provided in any of the switch systems 300, 400, 500, and 600 (or combinations thereof) discussed above. The inventors of the present disclosure have found that the height of the switch system of the present disclosure can present some difficulties in the transmission of signals between ports on the switch system and the processing system(s) provided in the switch system (e.g., particularly with regard to the transmission of such signals via traces on a circuit board that can experience degradation when transmitted relatively long distances), and thus the switch system 700 provides an embodiment that allows for the transmission of such signals via silicon photonics. The embodiment of the switch system 700 includes a chassis 702 that may be the any of the chassis 302, 402, 502, and 602 discussed above with regards to the switch systems 300, 400, 500, and 600, respectively. The chassis 702 houses or supports a processing system 704 that may be the processing system 304 provided with the switch system 300, and a port 706 that may be any of the ports 310a-310n in the communication system 310 provided with the switch system 300. As illustrated in FIG. 7, a cable 708 (e.g., a fibre optic cable) may be coupled to the port 706 (e.g., a fibre optic port) via a cable connector 708a (e.g., a fibre optic connector), and one of skill in the art in possession of the present disclosure will appreciate that the cable 708 may be connected on an opposing, unillustrated end to a server device as described herein.

In the illustrated embodiment, a transceiver 710 is coupled to the port 706 and may be provided by, for example, a pass-through transceiver that is configured to receive optical signals transmitted via the cable 708 and the port 706, and pass those optical signals to an input coupler 712. The input coupler 712 may couple the transceiver 710 to an optional optical modulator 714, and may be configured to transmit the optical signals provided by the transceiver 710 to the optional optical modulator 714. As will be appreciated by one of skill in the art in possession of the present disclosure, the optional optical modulator 714 may be configured to modulate the optical signals (e.g., to overcome interference issues when the signal is one of many that are being transmitted along a common optical transmission medium) and transmit the optical signals via an optical transmission medium such as the optical waveguide 716 illustrated in FIG. 7. However, the optional optical modulator 714 may be removed, and the input coupler 712 may provide optical signals directly to the optical waveguide 716 while remaining within the scope of the present disclosure as well.

The optical waveguide 716 extends between the optional optical modulator 714 and an optional optical demodulator 718 that maybe located relatively physical close to the processing system 704 in the chassis 702, and that is configured to receive optical signals transmitted via the optical waveguide 716 and demodulate those optical signals in the event they have been modulated by the optional optical modulator 714. As such, the optional optical demodulator 708 may be removed from the switch system 700 while remaining within the scope of the present disclosure as well. A photoelectric converter 720 is coupled to the optical demodulator 718 (or directly to the optical waveguide 716 in the event the optional optical demodulator 718 is not present), and may be configured to convert the optical signals received from the optical demodulator 718 to electrical signals, and provide those electrical signals to the processing system 704 for processing. While one of skill in the art in possession of the present disclosure will recognize that the processing system 704 is illustrated as receiving and processing electrical signals, a processing system that is configured to process optical signals may replace the processing system 704 in the switch system 700, allowing from the removal of the photoelectrical converter 720 and the receiving of optical signals by that processing system directly from the optical demodulator 718 or the optical waveguide 716.

Figure 8:
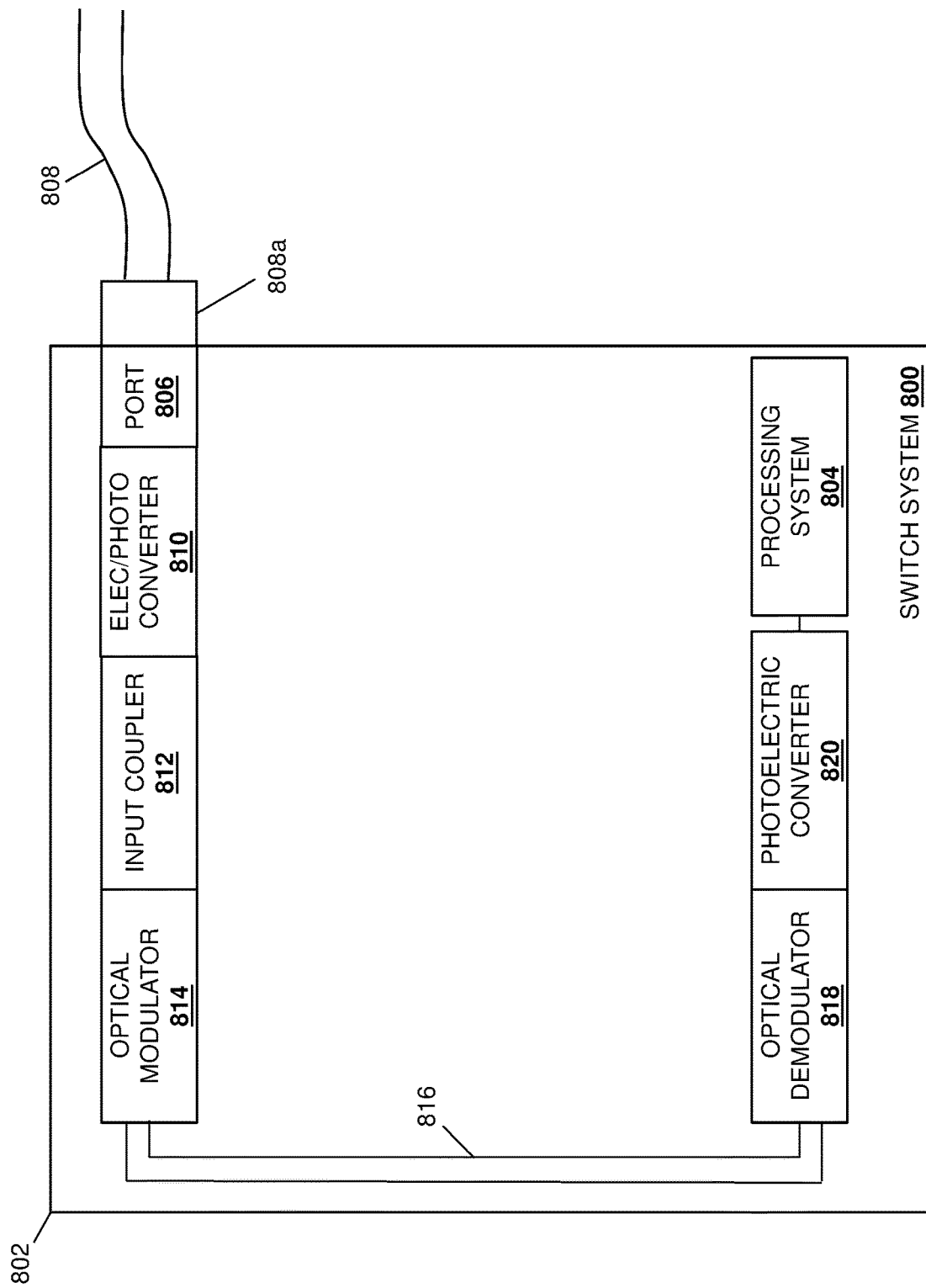
FIG. 8 is a schematic view illustrating an embodiment of a switch system that may provide the rack switch coupling system of the present disclosure.

Referring now to FIG. 8, an embodiment of a switch system 800 is illustrated that includes processing system/port coupling features that may be provided in any of the switch systems 300, 400, 500, and 600 discussed above. As discussed above, the inventors of the present disclosure have found that the height of the switch system of the present disclosure can present some difficulties in the transmission of signals between ports on the switch system and the processing system provided in the switch system (e.g., particularly with regard to the transmission of such signals via traces on a circuit board that can experience degradation when transmitted relatively long distances), and thus the switch system 800 provides an embodiment that allows for the transmission of such signals via silicon photonics. The embodiment of the switch system 800 includes a chassis 802 that may be the any of the chassis 302, 402, 502, and 602 discussed above with regards to the switch systems 300, 400, 500, and 600, respectively. The chassis 802 houses or supports a processing system 804 that may be the processing system 304 provided with the switch system 300, and a port 806 that may be any of the ports 310a-310n in the communication system 310 provided with the switch system 300. As illustrated in FIG. 8, a cable 808 (e.g., an Ethernet cable)

may be coupled to the port 806 (e.g., an Ethernet port) via a cable connector 808a (e.g., an Ethernet connector), and one of skill in the art in possession of the present disclosure will appreciate that the cable 808 may be connected on an opposing, unillustrated end to a server device as described herein.

In the illustrated embodiment, an electric-to-photo converter 810 may be coupled to the port 806 and configured to convert electrical signals received via the cable 808 and from the port 806 to optical signals, and provide those optical signals to an input coupler 812. The input coupler 812 may couple the electric-to-photo converter 810 to an optional optical modulator 814, and may be configured to transmit the optical signals received from the electric-to-photo converter 810 to the optional optical modulator 814. As will be appreciated by one of skill in the art in possession of the present disclosure, the optical modulator 814 may be configured to modulate the optical signals (e.g., to overcome interference issues when the signal is one of many that are being transmitted along a common optical transmission medium) and transmit the optical signals via an optical transmission medium such as the optical waveguide 816 illustrated in FIG. 8. However, the optional optical modulator 814 may be removed, and the input coupler 812 may provide optical signals directly to the optical waveguide 816 while remaining within the scope of the present disclosure as well.

The optical waveguide 816 extends between the optional optical modulator 814 and an optional optical demodulator 818 that is located relatively physically close to the processing system 804, and that is configured to receive optical signals transmitted via the optical waveguide 816 and demodulate those optical signals in the event they have been modulated by the optional optical modulator 814. As such, the optional optical demodulator 808 may be removed from the switch system 800 while remaining within the scope of the present disclosure as well. A photoelectric converter 820 is coupled to the optical demodulator 818 (or directly to the optical waveguide 816 in the event the optional optical demodulator 818 is not present) and configured to convert the optical signals received from the optical demodulator 818 to electrical signals, and provide those electrical signals to the processing system 804 for processing. While one of skill in the art in possession of the present disclosure will recognize that the processing system 804 is illustrated as receiving and processing electrical signals, a processing system that is configured to process optical signals may replace the processing system 804 in the switch system 800, allowing from the removal of the photoelectrical converter 820 and the receiving of optical signals by that processing system directly from the optical demodulator 818 or the optical waveguide 816.

Figure 9:
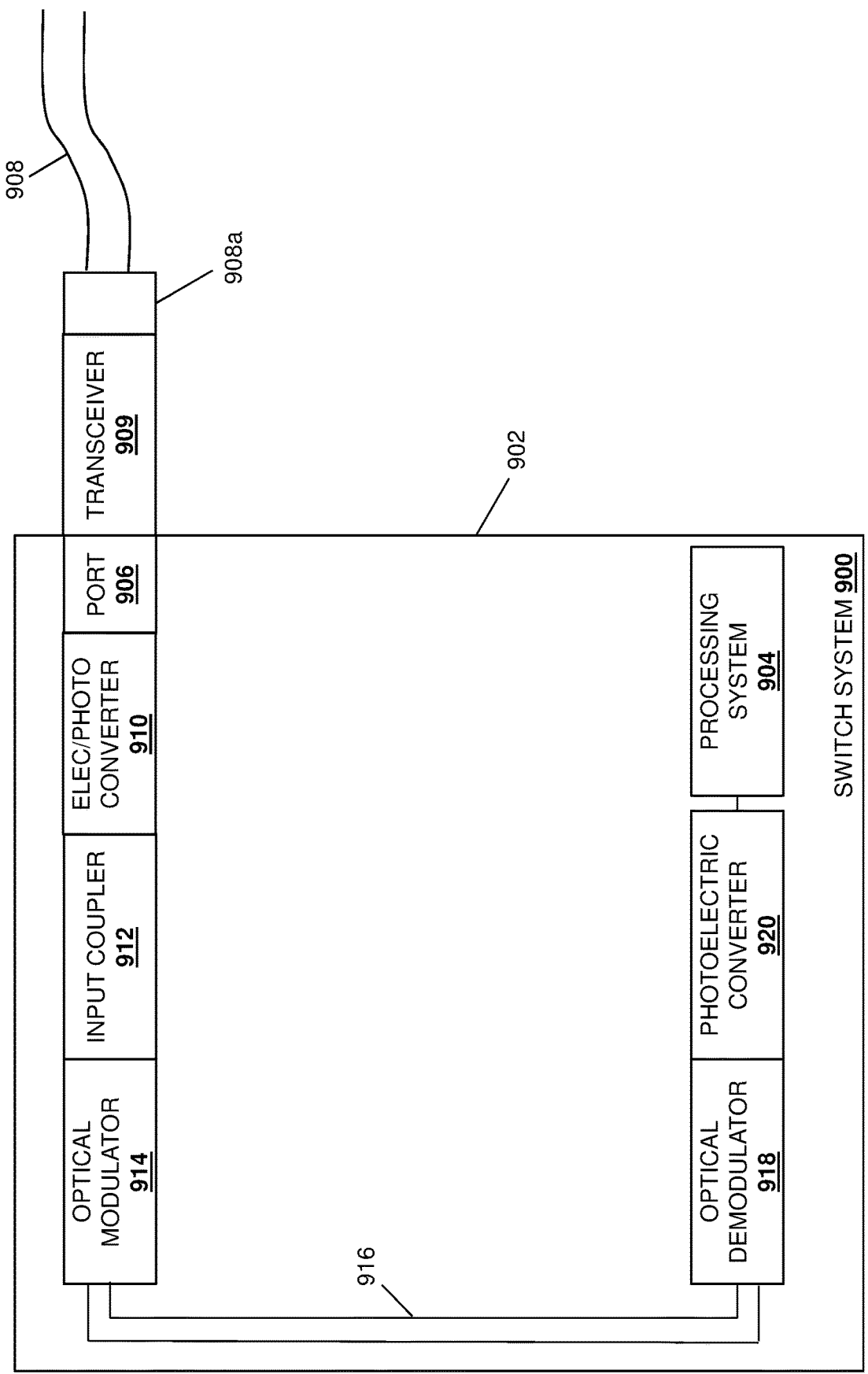
FIG. 9 is a schematic view illustrating an embodiment of a switch system that may provide the rack switch coupling system of the present disclosure.

Referring now to FIG. 9, an embodiment of a switch system 900 is illustrated that includes processing system/port coupling features that may be provided in any of the switch systems 300, 400, 500, and 600 discussed above. As discussed above, the inventors of the present disclosure have found that the height of the switch system of the present disclosure can present some difficulties in the transmission of signals between ports on the switch system and the processing system provided in the switch system (e.g., particularly with regard to the transmission of such signals via traces on a circuit board that can experience degradation when transmitted relatively long distances), and thus the switch system 900 provides an embodiment that allows for the transmission of such signals via silicon photonics. The embodiment of the switch system 900 includes a chassis 902 that may be the any of the chassis 302, 402, 502, and 602 discussed above with regards to the switch systems 300, 400, 500, and 600, respectively. The chassis 902 houses or supports a processing system 904 that may be the processing system 304 provided with the switch system 300, and a port 906 that may be any of the ports 310a-310n in the communication system 310 provided with the switch system 300. As illustrated in FIG. 9, a cable 908 (e.g., a fibre optic cable) may be coupled to the port 906 (e.g., a fibre optic port) via a cable connector 908a (e.g., a fibre optic connector), and one of skill in the art in possession of the present disclosure will appreciate that the cable 908 may be connected on an opposing, unillustrated end to a server device as described herein.

In the illustrated embodiment, a transceiver 909 couples the cable 908 to the port 906, and may be configured to convert optical signals transmitted by the cable 908 to electrical signals, and provide those electrical signals to the port 906. An electric-to-photo converter 910 may be coupled to the port 906 and configured to convert the electrical signals received from the port 806 to optical signals, and provide those optical signals to an input coupler 912. The input coupler 912 may couple the electric-to-photo converter 910 to an optional optical modulator 914, and may be configured to transmit the optical signals received from the electric-to-photo converter 910 to the optional optical modulator 914. As will be appreciated by one of skill in the art in possession of the present disclosure, the optical modulator 914 may be configured to modulate the optical signals (e.g., to overcome interference issues when the signal is one of many that are being transmitted along a common optical transmission medium) and transmit the optical signals via an optical transmission medium such as the optical waveguide 916 illustrated in FIG. 9. However, the optional optical modulator 914 may be removed, and the input coupler 912 may provide optical signals directly to the optical waveguide 916 while remaining within the scope of the present disclosure as well.

The optical waveguide 916 extends between the optional optical modulator 914 and an optional optical demodulator 918 that is located relatively close to the processing system 904, and that is configured to receive optical signals transmitted via the optical waveguide 916 and demodulate those optical signals in the event they have been modulated by the optional optical modulator 914. As such, the optional optical demodulator 908 may be removed from the switch system 900 while remaining within the scope of the present disclosure as well. A photoelectric converter 920 is coupled to the optical demodulator 918 (or directly to the optical waveguide 916 in the event the optional optical demodulator 918 is not present) and configured to convert the optical signals received from the optical demodulator 918 to electrical signals, and provide those electrical signals to the processing system 904 for processing. While one of skill in the art in possession of the present disclosure will recognize that the processing system 904 is illustrated as receiving and processing electrical signals, a processing system that is configured to process optical signals may replace the processing system 904 in the switch system 900, allowing from the removal of the photoelectrical converter 920 and the receiving of optical signals by that processing system directly from the optical demodulator 918 or the optical waveguide 916.

As will be appreciated by one of skill in the art in possession of the present disclosure, the switch system of the present disclosure may be provided in racks that can exceed six feet in height, and thus the physical distance between any processing system in the switch system and any particular port in the switch system may be several feet. As such signal integrity issues may exists if signals are transmitted within the switch system using traditional processing system/port coupling methods (e.g., traces on a motherboard), particular with regard to signals transmitted by a processing system to the ports that are furthest from that processing system, and the silicon photonic techniques described above with reference to the switch systems 700, 800, and 900 may be provided in order to couple at least some of the ports in the switch system to the processing systems in that switch system.

As such, the switch system of the present disclosure may be provided with a motherboard and traces coupling at least one of its processing systems to at least some ports that are close enough to that processing system so as to not introduce signal integrity issues, while the silicon photonic techniques discussed above may be utilized to couple that processing system to at least some of the other ports (e.g., with the optical waveguide extending along the majority of the distance between the port and the processing system to transit signals between the two.) However, the silicon photonic techniques described herein may couple all of the ports on the switch system to the processing systems in that switch system while remaining within the scope of the present disclosure as well. Further still, one of skill in the art in possession of the present disclosure will appreciate that the optical transmission medium described above with respect to the switch systems 700, 800, and 900 (e.g., the optical waveguides 616, 716, and 816) may be provided for each processing system/port connection, or provided for multiple processing system/port connections (e.g., while using the modulation described above to distinguish optical signals that are to be provided for different ports.) As such, a wide variety of modification and combination of the embodiments discussed above is envisioned as falling within the scope of the present disclosure.

In a specific example utilizing a 42U rack that is approximately 6 feet tall, an embodiment of the switch system of the present disclosure may be 6 feet tall as well, with a switching ASIC and/or other switching components located centrally along its height, providing approximately 3 feet of distance between that switching ASIC and the ports located near the top wall and bottom wall of the rack. As such, approximately 3 foot long optical waveguides may be utilized in the switch system to couple the switching ASIC to those ports. However, when redundant switching ASICs are provided in the switch system, the length of the optical waveguides may be reduced. For example, in a two switching ASIC switch system, a first switching ASIC may be located 18 inches/1.5 feet from the top wall of the rack, and a second switching ASIC may be located 18 inches/1/4 feet from the bottom of the rack, requiring 18 inch/1.5 foot long optical waveguides for the ports further from each of those switching ASICs.

Figure 10:
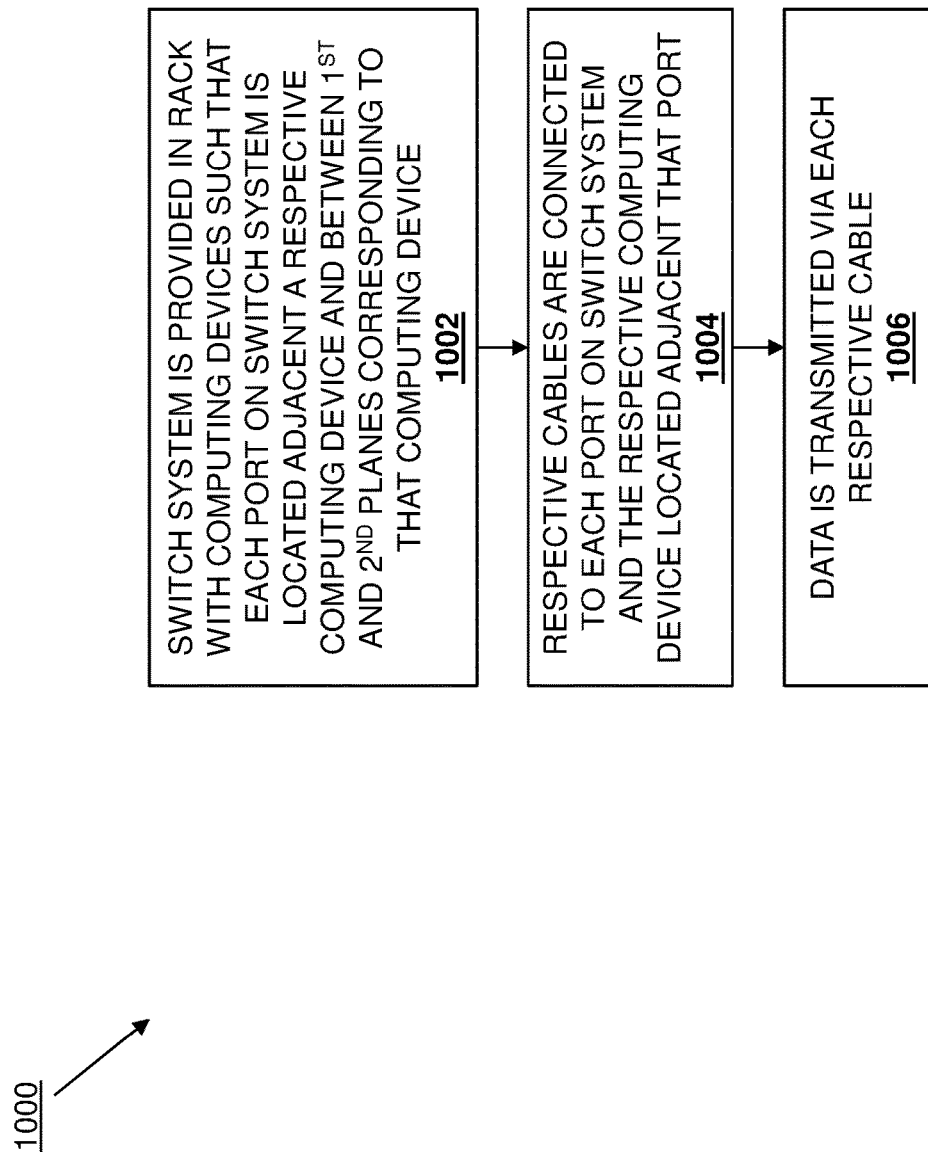
FIG. 10 is a flow chart illustrating an embodiment of a method for coupling a switch device in a rack.

Referring now to FIG. 10, an embodiment of a method 1000 for coupling a switch device in a rack is illustrated. As discussed below, the systems and methods of the present disclosure provide a switch system that extends at least partially along the height of a rack, with ports on that switch system located adjacent each computing device in that rack, eliminating the need for any substantial cable routing of the cables between those computing devices and ports and the issues associated with such cable routing. For example, a rack may include a plurality of computing devices that are positioned in the rack in a stacked orientation, with each of the computing devices including a top surface that corresponds with a first plane associated with that computing device, and a bottom surface that is located opposite that computing device from the top surface and that corresponds with a second plane associated with that computing device. A switch system positioned in the rack may include respective ports cabled to each of the plurality of computing devices, with each of the respective ports located adjacent the computing device to which it is cabled and between the first plane and the second plane associated with that computing device. As will be appreciated by one of skill in the art in possession of the present disclosure, the switch system of the present disclosure greatly reduces the length of the cables required to couple the computing devices to the switch system, thus reducing airflow issues introduce by conventional cables, reducing the difficulties in adding/removing computing devices to the rack and/or tracing the connection between the switch device and any particular computing device, and providing other benefits that will be apparent to one of skill in the art in possession of the present disclosure.

The method 1000 begins at block 1002 where a switch system is provided in a rack with computing devices such that each port on the switch system is located adjacent a respective computing device and between first and second planes corresponding to that computing device. In an embodiment, at block 1002, the switch system 300 discussed above with reference to FIGS. 3A and 3B may be provided in a rack including a plurality of computing devices. With reference to FIG. 11, an embodiment of a rack 1100 is illustrated that includes a plurality of server devices 1102a, 1102b, 1102c, 1102d, 1102e, 1102f, 1102g, 1102h, 1102i, 1102j, 1102k, 1102l, 1102m, and 1102n. However, while illustrated and discussed as including server devices 1102a-1102n, one of skill in the art in possession of the present disclosure will appreciate that the rack 1100 may include storage systems and/or other computing devices while remaining within the scope of the present disclosure as well. In some embodiments, the rack 1100 may be a conventional rack that is similar to the rack 200 discussed above with reference to FIG. 2, but with modifications necessary to couple with the switch system of the present disclosure. For example, many conventional racks are 1070 millimeters deep and 600 millimeters wide, and one of skill in the art in possession of the present disclosure will appreciate how the switch system of the present disclosure may be designed to fit in such racks (or modified versions of such racks.)

In other examples, the rack 1100 may be provided by newer rack designs that are being developed (e.g., NetShelter SX series racks available from Schneider Electric of Rueil-Malmaison, France) to provide additional space (both front-to-back and side-to-side) in the rack, offering up to 1200 millimeters of depth and/or up to 750 millimeters of width, and one of skill in the art in possession of the present disclosure will appreciate how the switch system of the present disclosure may be designed to fit in such racks. However, while a few specific examples have been provided, one of skill in the art in possession of the present disclosure will appreciate that the rack 1100 may be provided to couple with the switch system of the present disclosure in a variety of manners that will fall within the scope of the present disclosure as well. As such, the rack 1100 may include features for coupling to and securing both the server devices 1102a-1102n and the switch system of the present disclosure.

Figure 11A:
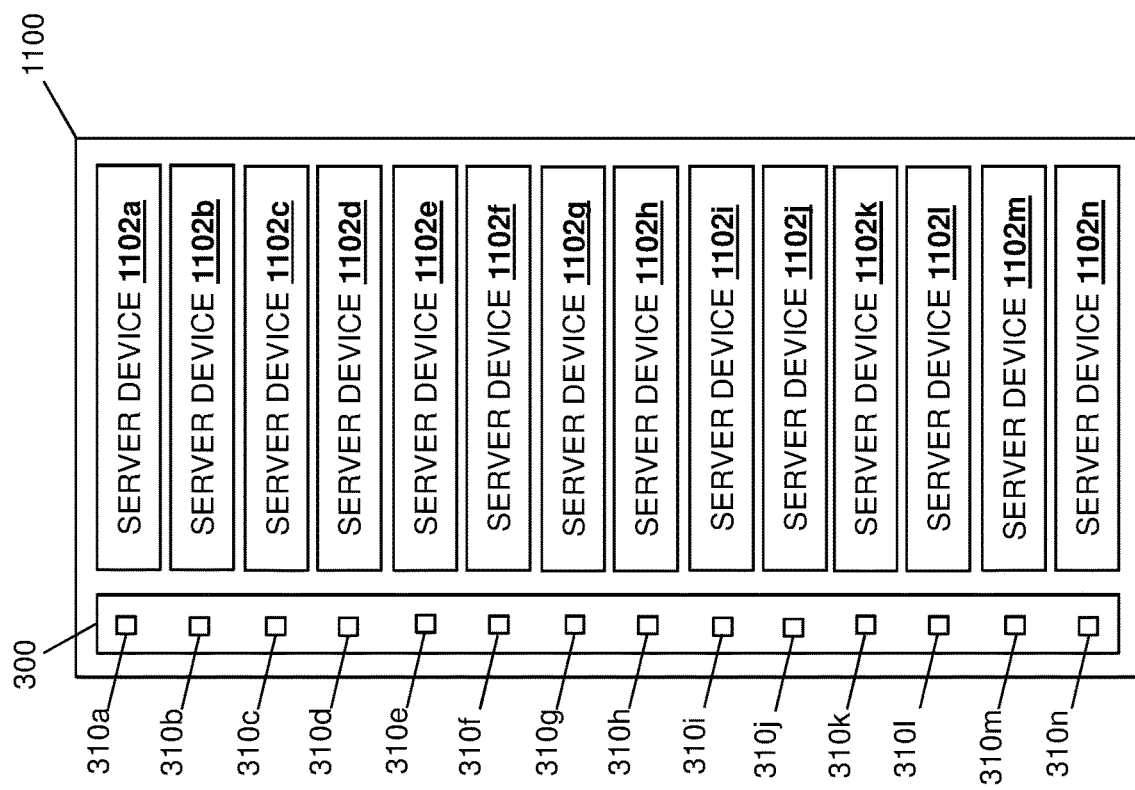
FIG. 11A is a schematic view illustrating an embodiment of the switch system of FIGS. 3A and 3B located in a rack during the method of FIG. 10 to provide the rack switch coupling system of the present disclosure.
Figure 11B:
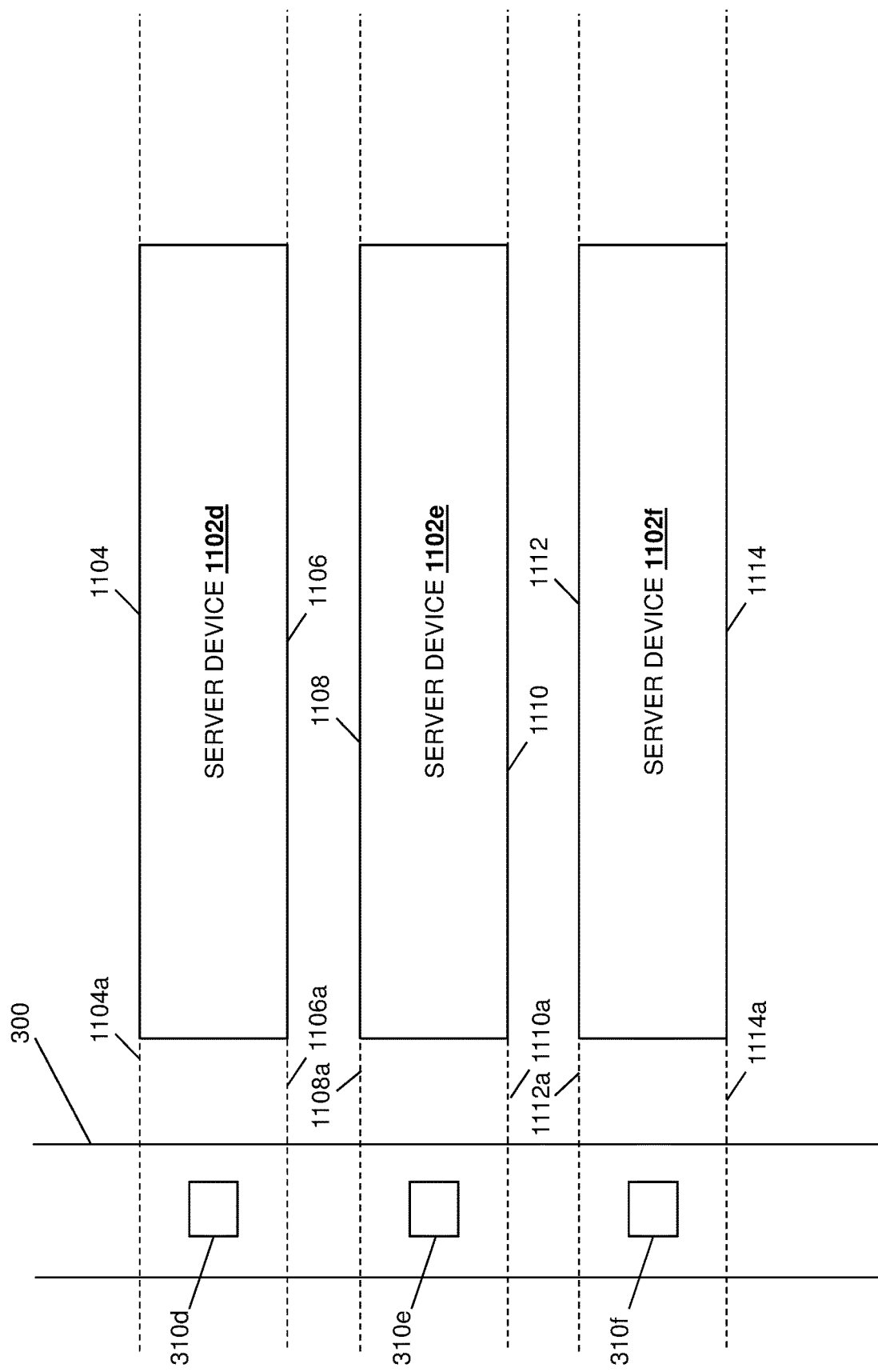
FIG. 11B is a schematic view illustrating an embodiment of some of the ports on the switch system of FIG. 11A located respective server devices provided in the rack of FIG. 11A.

FIGS. 11A and 11B illustrate the switch system 300 provided in the rack 1100 and, as can be seen in the illustrated embodiment, the switch system 300 may span the entire height of the rack 1100, with each port 310a-310n on the switch system 300 located adjacent a respective server device 1102*a-n*. For example, FIG. 11B illustrates how the server device 1102*d* may include a top surface 1104 that corresponds a top plane 1104*a* for that server device 1102*d*, and a bottom surface 1106 that corresponds to a bottom plane 1106*a* for that server device 1102*d*. Similarly, FIG. 11B illustrates how the server device 1102*e* may include a top surface 1108 that corresponds a top plane 1108*a* for that server device 1102*e*, and a bottom surface 1110 that corresponds to a bottom plane 1110*a* for that server device 1102*e*. Similarly as well, FIG. 11B illustrates how the server device 1102*f* may include a top surface 1112 that corresponds a top plane 1112*a* for that server device 1102*f*, and a bottom surface 1114 that corresponds to a bottom plane 1114*a* for that server device 1102*f*.

As such, in some embodiments, the ports 310*a*-310*n* on the switch system 300 being located adjacent a respective server device 1102*a*-1102*n* in the rack 1100 may include each of those ports being located between the top and bottom planes for that respective server device. For example, FIG. 11B illustrates the port 310*d* on the switch system 300 located between the top plane 1104*a* and the bottom plane 1006*a* for the server device 1102*d*, the port 310*e* on the switch system 300 located between the top plane 1108*a* and the bottom plane 1010*a* for the server device 1102*e*, and the port 310*f* on the switch system 300 located between the top plane 1112*a* and the bottom plane 1014*a* for the server device 1102*f*, and one of skill in the art in possession of the present disclosure will appreciate that the remaining ports on the switch system 300 may be located adjacent their respective server devices in the rack 1100 in a similar manner as well. However, while the adjacency of the ports and their respective computing devices is described herein based on top and bottom planes associated with those computing devices, one of skill in the art in possession of the present disclosure will appreciate that port/computing device adjacency that provides the benefits of the present disclosure may be defined in a variety of other manners that will fall within the scope of the present disclosure as well.

The method 1000 then proceeds to block 1004 where respective cables are connected to each port on the switch system and the respective computing device located adjacent that port. In an embodiment, at block 1004, a cable may be connected to each port on the switch system 300 and the respective server device located adjacent that port. For example, with reference to FIGS. 12A and 12B, a cable 1200*a* is illustrated as connected to the port 310*a* on the switch system 300 and the server device 1102*a* located adjacent the port 310*a*, a cable 1200*b* is illustrated as connected to the port 310*b* on the switch system 300 and the server device 1102*b* located adjacent the port 310*b*, a cable 1200*c* is illustrated as connected to the port 310*c* on the switch system 300 and the server device 1102*c* located adjacent the port 310*c*, a cable 1200*d* is illustrated as connected to the port 310*d* on the switch system 300 and the server device 1102*d* located adjacent the port 310*d*, a cable 1200*e* is illustrated as connected to the port 310*e* on the switch system 300 and the server device 1102*e* located adjacent the port 310*e*, a cable 1200*f* is illustrated as connected to the port 310*f* on the switch system 300 and the server device 1102*f* located adjacent the port 310*f*, a cable 1200*g* is illustrated as connected to the port 310*g* on the switch system 300 and the server device 1102*g* located adjacent the port 310*g*, a cable 1200*h* is illustrated as connected to the port 310*h* on the switch system 300 and the server device 1102*h* located adjacent the port 310*h*, a cable 1200*i* is illustrated as connected to the port 310*i* on the switch system 300 and the server device 1102*i* located adjacent the port 310*i*, a cable 1200*j* is illustrated as connected to the port 310*j* on the switch system 300 and the server device 1102*j* located adjacent the port 310*j*, a cable 1200*k* is illustrated as connected to the port 310*k* on the switch system 300 and the server device 1102*k* located adjacent the port 310*k*, a cable 1200*l* is illustrated as connected to the port 310*l* on the switch system 300 and the server device 1102*l* located adjacent the port 310*l*, a cable 1200*m* is illustrated as connected to the port 310*m* on the switch system 300 and the server device 1102*m* located adjacent the port 310*m*, and a cable 1200*n* is illustrated as connected to the port 310*n* on the switch system 300 and the server device 1102*n* located adjacent the port 310*n*

As will be appreciated by one of skill in the art in possession of the present disclosure, embodiments of the rack switch coupling system of the present disclosure illustrated in FIGS. 11A, 11B, 12A, and 12B allows for the coupling of the server devices 1102*a*-1102*n* to the switch system 300 via a plurality of relatively short, equal length cables 1200*a*-1200*n* that do not need to be routed along the height of the rack 1100 to the switch system 300, or bundled together as part of their routing to the switch system 300. As such, one of skill in the art in possession of the present disclosure will appreciate that the airflow issues, server device addition/removal issues from the rack, server device/switch system connection tracing issues, and/or other issues associated with conventional rack switch coupling systems are reduced and/or substantially eliminated.

The method 1000 then proceeds to block 1006 where data is transmitted via each respective cable. In an embodiment, at block 1006, the processing system 304 in the switch system 300 may operate to transmit data via the cables 1200*a*-1200*n* with the respective server devices 1102*a*-1102*n* while performing any of a variety of conventional switching operations that would be apparent to one of skill in the art in possession of the present disclosure. As such, the switch system 300 may utilize the components of the switch system 700 discussed above to receive optical signals from a server device, transmit those optical signals via an optical waveguide, convert the optical signals to electrical signals, and process those electrical signals as part of the data transmission operations at block 1006. Similarly, the switch system 300 may utilize the components of the switch system 800 discussed above to receive electrical signals from a server device, convert those electrical signals to optical signals, transmit those optical signals via an optical waveguide, convert the optical signals to electrical signals, and process those electrical signals as part of the data transmission operations at block 1006. Similarly as well, the switch system 300 may utilize the components of the switch system 900 discussed above to receive electrical signals from a transceiver that converted optical signals from a server device to produce those electrical signals, convert those electrical signals back to optical signals, transmit those optical signals via an optical waveguide, convert the optical signals to electrical signals, and process those electrical signals as part of the data transmission operations at block 1006. However, while a few specific examples have been provided, one of skill in the art in possession of the present disclosure will appreciate that the data transmission performed at block 1006 may include a variety of other operations that will fall within the scope of the present disclosure as well.

Thus, systems and methods have been described that provide a switch system that extends at least partially along the height of a rack, with ports on that switch system located adjacent each computing device in that rack, allowing for cabling that eliminates the need for any substantial cable routing of the cables between those computing devices and ports and the issues associated with such cable routing. For example, a switch system positioned in a rack may include respective ports cabled to each of a plurality of computing devices in the rack, with each of the respective ports located adjacent the computing device to which it is cabled and between first and second planes corresponding to top and bottom surfaces of that computing device. As will be appreciated by one of skill in the art in possession of the present disclosure, the switch system of the present disclosure frees up space in racks for housing computing devices that has traditionally be utilized for housing switch devices, allows for more cost efficient and easier to install cabling, reduces the amount of time need to add/remove cabling, provides for easier tracing and troubleshooting of cabled ports, reduces the blockage of airflow in the rack introduced by conventional cable routing techniques, reduces the blocking of device status indicators/LEDs introduced by conventional cable routing techniques, reduces the blocking of text on devices that is introduced by conventional cable routing techniques, minimizes cabling mistakes (e.g., the connection of a cable to or removal of a cable from the wrong port), reduces or eliminates the need for cable management systems/hardware, provides for a neater/more organized rack appearance, may be optimized for storing the cables utilized in the rack, narrows the variation in cable lengths utilized with the rack to reduce complexity in cable ordering, and/or provides a variety of other benefits that would be apparent to one of skill in the art in possession of the present disclosure.

Figure 13:
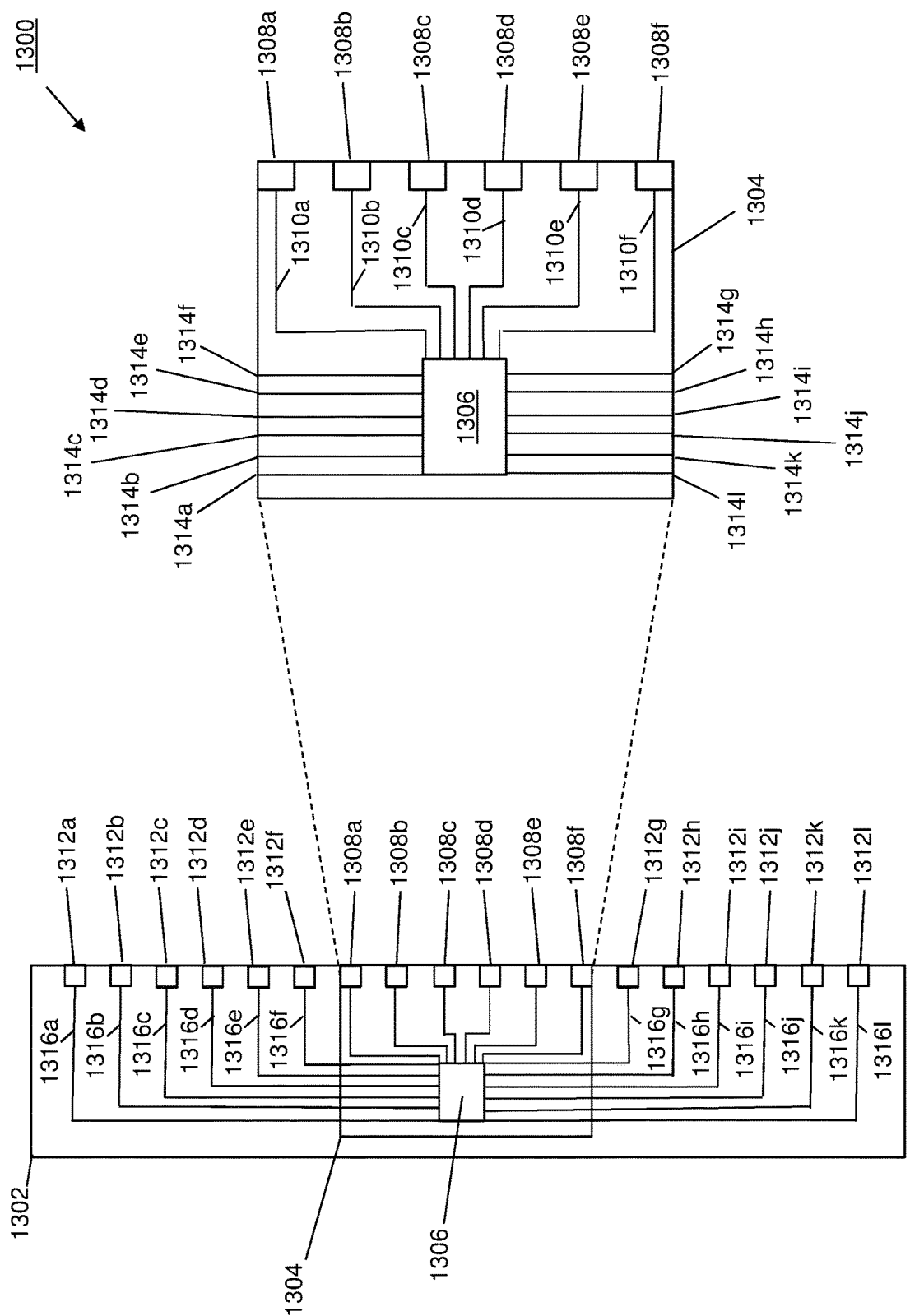
FIG. 13 is a schematic view illustrating an embodiment of a switch system that may provide the rack switch coupling system of the present disclosure.

Referring now to FIG. 13, an embodiment of a switch system 1300 is illustrated that may provide the rack switch coupling system of the present disclosure. As such, the switch system 1300 may be provided by the IHS 100 discussed above with reference to FIG. 1 and/or may include some or all of the components of the IHS 100, and in specific examples, may provide any of a variety of switching functionality that would be apparent to one of skill in the art in possession of the present disclosure. However, while illustrated and discussed as a switch system providing switching functionality, one of skill in the art in possession of the present disclosure will recognize that the functionality of the switch system 1300 discussed below may be provided by other devices that are configured to operate similarly as the switch system 300 discussed below. As will be recognized by one of skill in the art in possession of the present disclosure, the switch system 1300 may provide an embodiment of the switch system 500 illustrated in FIG. 5 that includes switch system components 504a, 504b, 504c, 504d, and up to 504e (e.g., processing systems such as ASICs, switching fabrics, timing modules, FPGAs, CPLDs, etc.; memory systems such as flash memory devices, DRAM devices, etc.; and/or other switch components known in the art) that are provided in and/or on the chassis 502 in a centralized configuration that allows the switch system 500 to span the height of the rack in which it will be used. However, utilization of features of the switch system 1300 in other embodiments of the present disclosure will fall within its scope as well.

In the illustrated embodiment, the switch system 1300 includes a chassis 1302 that houses or supports the components of the switch system 1300, only some of which are illustrated and discussed below. In some examples, the chassis 1302 may include a plurality of chassis walls that define a chassis enclosure that houses the components of the switch system 1300. However, in other examples, the chassis 1302 may include one or more circuit boards that support at least some of the components of the switch system 1300. As such, one of skill in the art in possession of the present disclosure will appreciate that the chassis 1302 of the switch system 1300 may be provided in a variety of manners that will fall within the scope of the present disclosure as well.

In the illustrated embodiment, the chassis 1302 houses or supports a circuit board 1304 that is located in the chassis 1302, and for which an enlarged vie is provided in FIG. 13 (e.g., via the dotted lines) in order to clearly depict elements and element numbers for components included on the circuit board 1304. As will be appreciated by one of skill in the art in possession of the present disclosure, the circuit board 1304 may be provided by a motherboard and/or other circuit board structure that is configured to include any of the components discussed above including processing systems such as ASICs, switching fabrics, timing modules, FPGAs, CPLDs, etc.; memory systems such as flash memory devices, DRAM devices, etc.; and/or other switch components known in the art. FIG. 13 illustrates the circuit board 1304 as including a processing system 1306 that may be provided by any of the processing system components discussed above, and while not illustrated in FIG. 13, one of skill in the art in possession of the present disclosure will appreciate that the chassis 1302 may also include a memory system that includes any of the memory system components that are discussed above, that is coupled to the processing system 1306, and that may include instructions that, when executed by the processing system 1306, cause the processing system 1306 to perform the switching operations and/or other functionality of the switching systems discussed below.

Similarly as discussed above, the chassis 1302 may also house or support a communication system that is coupled to the processing system 1306 and that includes a plurality of ports that may be positioned along a height A of the chassis 1302 in a spaced-apart, stacked orientation relative to each other, with the height A provided as approximately equal to the height of a rack (e.g., the rack 202 illustrated in FIG. 2) in which the switch system 1300 will be used, and the spacing and location of the ports provided such that each respective port is located adjacent a corresponding server device (e.g., the server devices 206a-206j) in the rack in which the switch system 1300 will be used. However, as discussed below, the switch system 1300 illustrated in FIG. 13 may include a chassis that extends only along a portion of a height the rack in which it will be used (e.g., along half of the height of that rack, along one-third of the height of that rack, along a quarter of the height of that rack, etc.) while remaining with the scope of the present disclosure as well.

In the embodiment illustrated in FIG. 13, the plurality of ports included in the communication system housed in or supported by the chassis 1302 include a plurality of first ports 1308a, 1308b, 1308c, 1308d, 1308e, and 1308f that are located on the circuit board 1304 (e.g., mounted to the circuit board 1304) and coupled to the processing system 1306 by respective traces 1310a, 1310b, 1310c, 1310d, 1310e, and 1310f that are included on the circuit board 1304 and that extend between the processing system 1306 and respective first ports in order to allow signals to be transmitted between the processing system 1306 and those first ports via those traces. While only six first ports are illustrated in FIG. 13, one of skill in the art in possession of the present disclosure will appreciate that different numbers of first ports may be located on the circuit board 1304 and coupled to the processing system 1306 by respective traces while remaining within the scope of the present disclosure. For example, in some embodiments, the number of first ports provided on the circuit board 1304 may be limited by the length of the longest trace that can transmit a signal to a port located on the circuit board 1304 the furthest distance from the processing system 1306 (i.e., relative to the other first ports), and thus first ports may be provide on the circuit board 1304 up to the maximum distance available based on the limitations of traces to transmit signals with sufficient signal integrity. However, one of skill in the art in possession of the present disclosure will appreciate that fewer ports may be provided on the circuit board 1304 at less than the maximum distance available based on the limitations of traces while remaining within the scope of the present disclosure as well.

In the embodiment illustrated in FIG. 13, the plurality of ports included in the communication system housed in or supported by the chassis 1302 also include a plurality of second ports 1312$a$, 1312$b$, 1312$c$, 1312$d$, 1312$e$, 1312$f$, 1312$g$, 1312$h$, 1312$i$, 1312$j$, 1312$k$, and 1312$l$ that are located off the circuit board 1304 and coupled to the processing system 1306 by respective combinations of a cable and a trace that is included on the circuit board 1304. As such, the circuit board 1304 may include traces that extend between the processing system 1306 and a respective cable that connects to a respective second port in order to allow signals to be transmitted between the processing system 1306 and that respective second port. As will be appreciated by one of skill in the art in possession of the present disclosure, while not explicitly illustrated in FIG. 13, the circuit board 1304 may include any of a variety of trace/cable couplings in order to couple traces on the circuit board 1304 to respective cables that connect to respective second ports via any of a variety of cable/port couplings while remaining within the scope of the present disclosure.

For example, in FIG. 13, the second port 1312$a$ is coupled to the processing system 1306 by a trace 1314$a$ on the circuit board 1304 that extends between the processing system 1306 and a cable 1316$a$ that is coupled to the second port 1312$a$, the second port 1312$b$ is coupled to the processing system 1306 by a trace 1314$b$ on the circuit board 1304 that extends between the processing system 1306 and a cable 1316$b$ that is coupled to the second port 1312$b$, the second port 1312$c$ is coupled to the processing system 1306 by a trace 1314$c$ on the circuit board 1304 that extends between the processing system 1306 and a cable 1316$c$ that is coupled to the second port 1312$c$, the second port 1312$d$ is coupled to the processing system 1306 by a trace 1314$d$ on the circuit board 1304 that extends between the processing system 1306 and a cable 1316$d$ that is coupled to the second port 1312$d$, the second port 1312$e$ is coupled to the processing system 1306 by a trace 1314$e$ on the circuit board 1304 that extends between the processing system 1306 and a cable 1316$e$ that is coupled to the second port 1312$e$, the second port 1312$f$ is coupled to the processing system 1306 by a trace 1314$f$ on the circuit board 1304 that extends between the processing system 1306 and a cable 1316$f$ that is coupled to the second port 1312$f$, the second port 1312$g$ is coupled to the processing system 1306 by a trace 1314$g$ on the circuit board 1304 that extends between the processing system 1306 and a cable 1316$g$ that is coupled to the second port 1312$g$, the second port 1312$h$ is coupled to the processing system 1306 by a trace 1314$h$ on the circuit board 1304 that extends between the processing system 1306 and a cable 1316$h$ that is coupled to the second port 1312$h$, the second port 1312$i$ is coupled to the processing system 1306 by a trace 1314$i$ on the circuit board 1304 that extends between the processing system 1306 and a cable 1316$i$ that is coupled to the second port 1312$i$, the second port 1312$j$ is coupled to the processing system 1306 by a trace 1314$j$ on the circuit board 1304 that extends between the processing system 1306 and a cable 1316$j$ that is coupled to the second port 1312$j$, the second port 1312$k$ is coupled to the processing system 1306 by a trace 1314$k$ on the circuit board 1304 that extends between the processing system 1306 and a cable 1316$k$ that is coupled to the second port 1312$k$, and the second port 1312$l$ is coupled to the processing system 1306 by a trace 1314$l$ on the circuit board 1304 that extends between the processing system 1306 and a cable 1316$l$ that is coupled to the second port 1312$l$.

While only twelve second ports are illustrated in FIG. 13, one of skill in the art in possession of the present disclosure will appreciate that different numbers of second ports may be located off of the circuit board 1304 and coupled to the processing system 1306 by the respective trace/cable combinations discussed above while remaining within the scope of the present disclosure. For example, in some embodiments, the number of second ports included in the chassis 1304 and coupled to the processing system by the trace/cable combinations may be determined by the number of ports that are needed on the switch system 1300 in excess of the number of first ports that are available on the circuit board 1304 due to the limitations associated with the length of the longest trace that can transmit a signal to a port located on the circuit board 1304, discussed above. However, one of skill in the art in possession of the present disclosure will appreciate that second ports may be provided on the circuit board 1304 in greater numbers while remaining within the scope of the present disclosure as well. Furthermore, while a specific switch system 1300 has been illustrated, one of skill in the art in possession of the present disclosure will recognize that switch systems (or other devices and/or systems operating according to the teachings of the present disclosure in a manner similar to that described below for the switch system 1300) may include a variety of components and/or component configurations for providing conventional switching device functionality, as well as the functionality discussed below, while remaining within the scope of the present disclosure as well.

Figure 14:
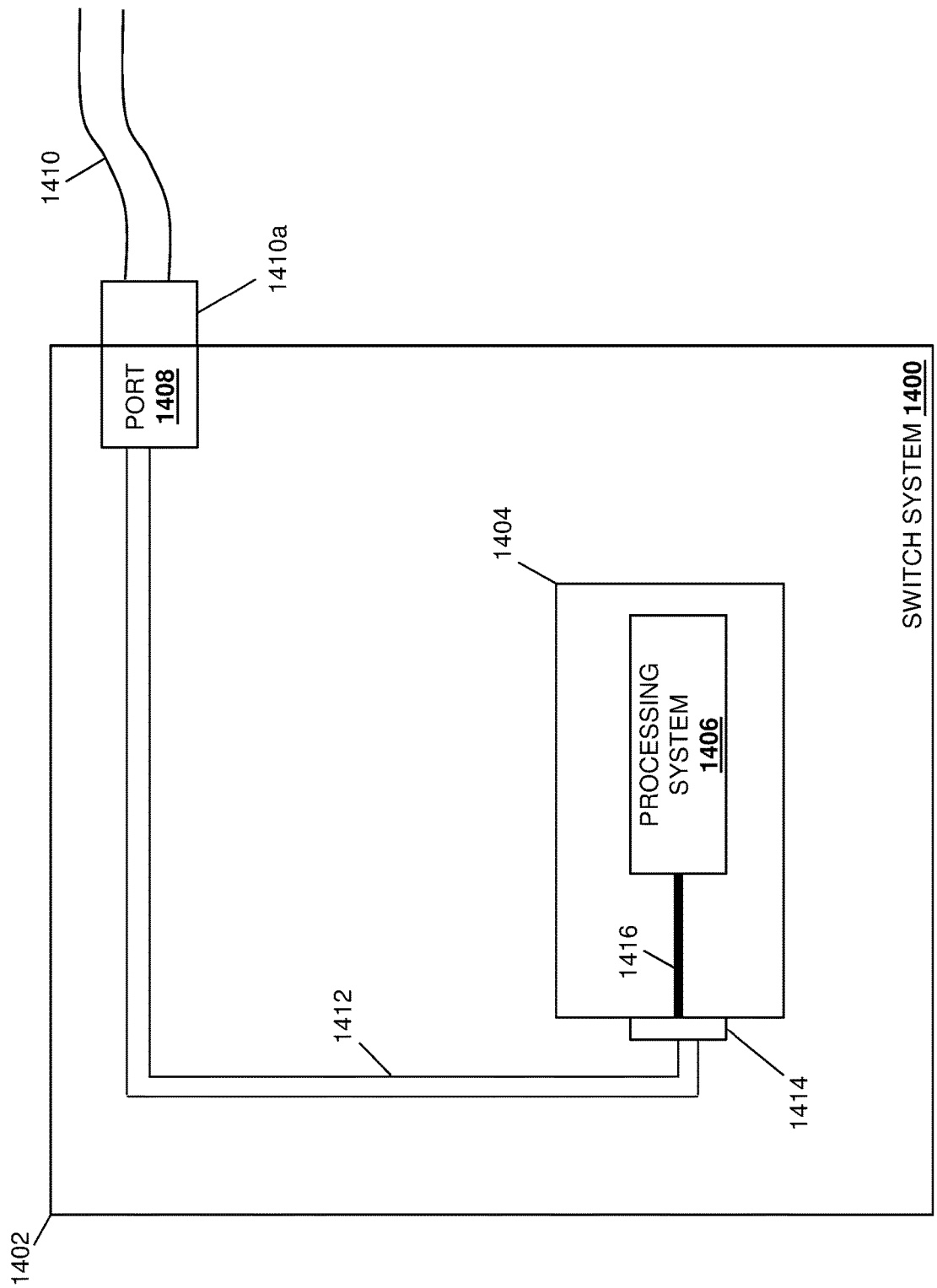
FIG. 14 is a schematic view illustrating an embodiment of a switch system that may provide the rack switch coupling system of the present disclosure.

Referring now to FIG. 14, an embodiment of a switch system 1400 is illustrated that includes processing system/port trace/cable coupling features that may be provided in the switch systems 500, 1300, and/or other switch systems discussed above. As discussed above, the inventors of the present disclosure have found that the height of the switch system of the present disclosure can present some difficulties in the transmission of signals between ports on the switch system and the processing system(s) provided in the switch system (e.g., particularly with regard to the transmission of such signals via traces on a circuit board that can experience degradation when transmitted relatively long distances), and thus the switch system 1400 provides an embodiment that allows for the transmission of such signals via traces and trace/cabling combinations. The embodiment of the switch system 1400 includes a chassis 1402 that may be the any of the chassis 502, 1302, and/or other chassis discussed above with regards to the switch systems 500, 1300, and other switch systems discussed above, respectively. The chassis 1402 houses or supports a circuit board 1404 (which may be the circuit board 1304 discussed above in the switch system 1300 of FIG. 13) that includes a processing system 1406 (which may be the processing system 1306 provided with the switch system 1300 of FIG. 13), as well as a second port 1408 that may be any of the second ports 1312$a$-1312$l$ in the communication system provided with the switch system 1300 of FIG. 13. As illustrated in FIG. 14, a cable 1410 (e.g., an Ethernet cable) may be coupled to the port 1408 (e.g., an Ethernet port) via a cable connector 1410*a* (e.g., an Ethernet connector), and one of skill in the art in possession of the present disclosure will appreciate that the cable 1410 may be connected on an opposing, unillustrated end to a server device as described herein.

In the illustrated embodiment, a cable 1412 is housed in the chassis 140*a* and extends between the port 1408 and a cable/trace coupling 1414 that is provided on the circuit board 1404. For example, the cable 1412 may be provided by an electrical cable such as a "copper" cable, Ethernet cable, and/or other cabling that one of skill in the art in possession of the present disclosure would recognize as being configured to transmit electrical signals, and as discussed below may be utilized to transmit electrical signals received from the cable 1410 (via the connection of the cable connector 1410*a* and the port 1408) to the circuit board 1404 via the cable/trace coupling 1414. Furthermore, the cable/trace coupling 1414 may be coupled to a trace 1416 (which may be any of the traces 1314*a*-1314*l* in the switch system 1300 of FIG. 13) that is included on the circuit board 1404, that extends between the cable/trace coupling 1414 and the processing system 1406, and that is configured to transmit signals received via the cable/trace coupling 1414 to the processing system 1406.

Figure 15:
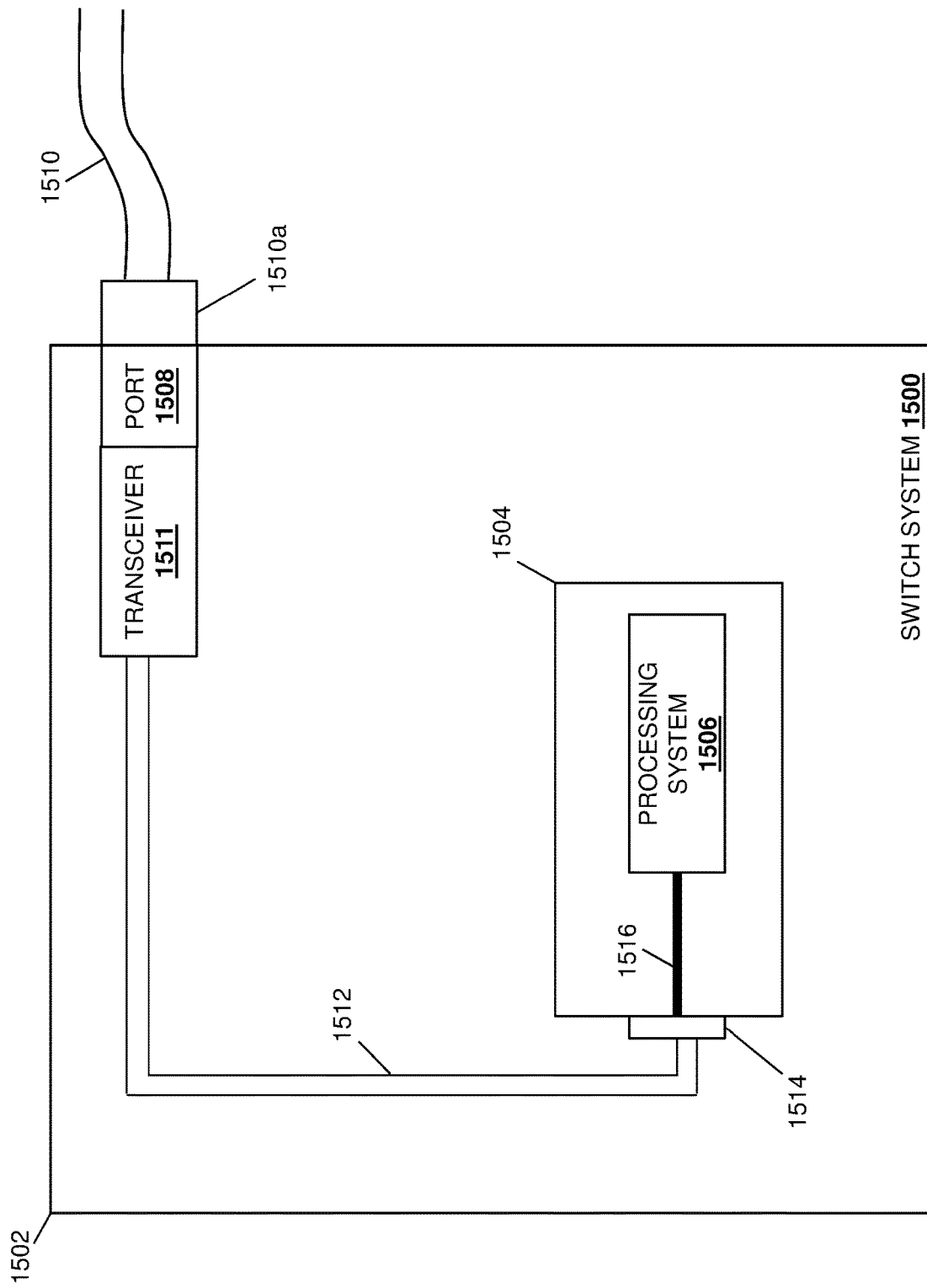
FIG. 15 is a schematic view illustrating an embodiment of a switch system that may provide the rack switch coupling system of the present disclosure.

Referring now to FIG. 15, an embodiment of a switch system 1500 is illustrated that includes processing system/port trace/cable coupling features that may be provided in the switch systems 500, 1300, and/or other switch systems discussed above. As discussed above, the inventors of the present disclosure have found that the height of the switch system of the present disclosure can present some difficulties in the transmission of signals between ports on the switch system and the processing system(s) provided in the switch system (e.g., particularly with regard to the transmission of such signals via traces on a circuit board that can experience degradation when transmitted relatively long distances), and thus the switch system 1500 provides an embodiment that allows for the transmission of such signals via traces and trace/cabling combinations. The embodiment of the switch system 1500 includes a chassis 1502 that may be the any of the chassis 502, 1302, and/or other chassis discussed above with regards to the switch systems 500, 1300, and other switch systems discussed above, respectively. The chassis 1502 houses or supports a circuit board 1504 (which may be the circuit board 1304 discussed above in the switch system 1300 of FIG. 13) that includes a processing system 1506 (which may be the processing system 1306 provided with the switch system 1300 of FIG. 13), as well as a second port 1508 that may be any of the second ports 1312*a*-1312*l* in the communication system provided with the switch system 1300 of FIG. 13. As illustrated in FIG. 15, a cable 1510 (e.g., a fiber optic cable) may be coupled to the port 1508 (e.g., a fiber optic port) via a cable connector 1510*a* (e.g., a fiber optic connector), and one of skill in the art in possession of the present disclosure will appreciate that the cable 1510 may be connected on an opposing, unillustrated end to a server device as described herein.

In the illustrated embodiment, a transceiver 1511 is coupled to the second port 1508 and may be configured to convert optical signals received via the second port 1508 from the cable 1510 to electrical signals. A cable 1512 extends between the transceiver 1512 and a cable/trace coupling 1514 that is provided on the circuit board 1504. For example, the cable 1512 may be provided by an electrical cable such as a "copper" cable, Ethernet cable, and/or other cabling that one of skill in the art in possession of the present disclosure would recognize as being configured to transmit electrical signals, and as discussed below may be utilized to transmit electrical signals received from the transceiver 1512 to the circuit board 1504 via the cable/trace coupling 1514. Furthermore, the cable/trace coupling 1514 may be coupled to a trace 1516 (which may be any of the traces 1314*a*-1314*l* in the switch system 1300 of FIG. 13) that is included on the circuit board 1504, that extends between the cable/trace coupling 1514 and the processing system 1506, and that is configured to transmit signals received via the cable/trace coupling 1514 to the processing system 1506.

Referring now to FIG. 16, an embodiment of a switch system 1600 is illustrated that includes processing system/port trace/cable coupling features that may be provided in the switch systems 500, 1300, and/or other switch systems discussed above. As discussed above, the inventors of the present disclosure have found that the height of the switch system of the present disclosure can present some difficulties in the transmission of signals between ports on the switch system and the processing system(s) provided in the switch system (e.g., particularly with regard to the transmission of such signals via traces on a circuit board that can experience degradation when transmitted relatively long distances), and thus the switch system 1600 provides an embodiment that allows for the transmission of such signals via traces and trace/cabling combinations. The embodiment of the switch system 1600 includes a chassis 1602 that may be the any of the chassis 502, 1302, and/or other chassis discussed above with regards to the switch systems 500, 1300, and other switch systems discussed above, respectively. The chassis 1602 houses or supports a circuit board 1604 (which may be the circuit board 1304 discussed above in the switch system 1300 of FIG. 13) that includes a processing system 1606 (which may be the processing system 1306 provided with the switch system 1300 of FIG. 13), as well as a second port 1608 that may be any of the second ports 1312*a*-1312*l* in the communication system provided with the switch system 1300 of FIG. 13. As illustrated in FIG. 16, a cable 1610 (e.g., a fiber optic cable) may be coupled to the port 1608 (e.g., a fiber optic port) via a cable connector 1610*a* (e.g., a fiber optic connector), and one of skill in the art in possession of the present disclosure will appreciate that the cable 1610 may be connected on an opposing, unillustrated end to a server device as described herein.

In the illustrated embodiment, a cable 1612 extends between the port 1608 and transceiver 1613 that may be configured to convert optical signals received via the cable 1612 to electrical signals, and a cable/trace coupling 1514 is provided on the circuit board 1504 and coupled to the transceiver 1613. For example, the cable 1612 may be provided by an optical cable such as a fiber optic cable and/or other cabling that one of skill in the art in possession of the present disclosure would recognize as being configured to transmit optical signals, and as discussed below may be utilized to transmit optical signals received from the cable 1610 (via the connection of the cable connector 1610*a* and the port 1608) to the transceiver 1613, which may then convert those optical signals to electrical signals and provide the electrical signals to the circuit board 1604 via the cable/trace coupling 1614. Furthermore, the cable/trace coupling 1614 may be coupled to a trace 1616 (which may be any of the traces 1314*a*-1314*l* in the switch system 1300 of FIG. 13) that is included on the circuit board 1604, that extends between the cable/trace coupling 1614 and the processing system 1606, and that is configured to transmit signals received via the cable/trace coupling 1614 to the processing system 1606.

As will be appreciated by one of skill in the art in possession of the present disclosure, the switch system of the present disclosure may be provided in racks that can exceed six feet in height, and thus the physical distance between any processing system in the switch system and any particular port in the switch system may be several feet. As such, signal integrity issues may exists if signals are transmitted within the switch system using traditional processing system/port coupling methods (e.g., traces on a motherboard), particular with regard to signals transmitted by a processing system to the ports that are furthest from that processing system, and the combined cable/trace processing system/port coupling techniques described above with reference to the switch systems 1400, 1500, and 1600 may be provided in order to couple second ports in the switch system that are located off of the motherboard to the processing systems in that switch system.

As such, the switch system of the present disclosure may be provided with a motherboard and traces coupling at least one of its processing systems to first ports that are included on the motherboard at a distance that is close enough to that processing system so as to not introduce signal integrity issues when a trace is used to transmit signals over that distance, while the cable/trace processing system/port coupling techniques discussed above may be utilized to couple that processing system to second ports that are located off of the motherboard and far enough away from that processing system that motherboard traces alone are not a coupling option (e.g., with the combination of a trace on the motherboard connected to a cable that extends along the distance between the port and the processing system to transmit signals between the two.) However, in some embodiments, the cable/trace processing system/port coupling techniques described herein may couple all of the ports on the switch system to the processing systems in that switch system while remaining within the scope of the present disclosure as well. Further still, one of skill in the art in possession of the present disclosure will appreciate that respective cables in the cable/trace couplings described above with respect to the switch systems 1400, 1500, and 1600 may be provided for each processing system/port connection, or a single cable/trace coupling may be provided for multiple processing system/port connections (e.g., while using the modulation similar to that described above to distinguish signals that are to be provided for different ports.) As such, a wide variety of modification and combination of the embodiments discussed above is envisioned as falling within the scope of the present disclosure.

In a specific example utilizing a 42U rack that is approximately 6 feet tall, an embodiment of the switch system of the present disclosure may be 6 feet tall as well, with a switching ASIC and/or other switching components located centrally along its height, providing approximately 3 feet of distance between that switching ASIC and the ports located near the top wall and bottom wall of the rack. As such, approximately 2-3 foot long cables may be utilized in the switch system to couple the switching ASIC to those ports. However, when redundant switching ASICs are provided in the switch system, the length of the cables may be reduced. For example, in a two switching ASIC switch system, a first switching ASIC may be located 18 inches/1.5 feet from the top wall of the rack, and a second switching ASIC may be located 18 inches/1/4 feet from the bottom of the rack, requiring 1-1.5 foot long cables for the ports furthest from each of those switching ASICs.

Referring back to FIG. 10, an embodiment of a method 1000 for coupling a switch device in a rack may utilize the switch systems 1300, 1400, 1500, and/or 1600 discussed above. Similarly as discussed above, the method 1000 may begin at block 1002 where a switch system is provided in a rack with computing devices such that each port on the switch system is located adjacent a respective computing device and between first and second planes corresponding to that computing device. In an embodiment, at block 1002, the switch system 1300 discussed above with reference to FIG. 13 may be provided in a rack including a plurality of computing devices. Similarly as illustrated and discussed above with respect to FIG. 11A, an embodiment of a rack 1100 includes a plurality of server devices 1102a-1102n, and in different examples, may be provided by conventional racks or newer rack designs that are being developed (e.g., NetShelter SX series racks available from Schneider Electric of Rueil-Malmaison, France) to provide additional space (both front-to-back and side-to-side) in the rack, offering up to 1200 millimeters of depth and/or up to 750 millimeters of width, and one of skill in the art in possession of the present disclosure will appreciate how the switch system of the present disclosure may be designed to fit in any such racks.

Similarly as illustrated in FIGS. 11A and 11B for the switch system 300 provided in the rack 1100, the switch system 1300 may be provided in the rack 1100 and span the entire height of the rack 1100, with each first port 1308a-1308f and second port 1312a-1312l on the switch system 1300 located adjacent a respective server device 1102a-n. As such, in some embodiments, the first ports 1308a-1308f and second ports 1312a-1312l on the switch system 1300 being located adjacent a respective server device 1102a-1102n in the rack 1100 may include each of those ports being located between the top and bottom planes for that respective server device. Similarly as illustrated in FIG. 11B for the port 310d, 310e, and 310f on the switch system 300, the second port 1312f on the switch system 1300 may be located between the top plane 1104a and the bottom plane 1006a for the server device 1102d, the first port 1308a on the switch system 1300 may be located between the top plane 1108a and the bottom plane 1010a for the server device 1102e, and the first port 1308b on the switch system 1300 may be located between the top plane 1112a and the bottom plane 1014a for the server device 1102f, and one of skill in the art in possession of the present disclosure will appreciate that the remaining first ports and second ports on the switch system 1300 may be located adjacent their respective server devices in the rack 1100 in a similar manner as well. However, while the adjacency of the ports and their respective computing devices is described herein based on top and bottom planes associated with those computing devices, one of skill in the art in possession of the present disclosure will appreciate that port/computing device adjacency that provides the benefits of the present disclosure may be defined in a variety of other manners that will fall within the scope of the present disclosure as well.

Figure 12B:
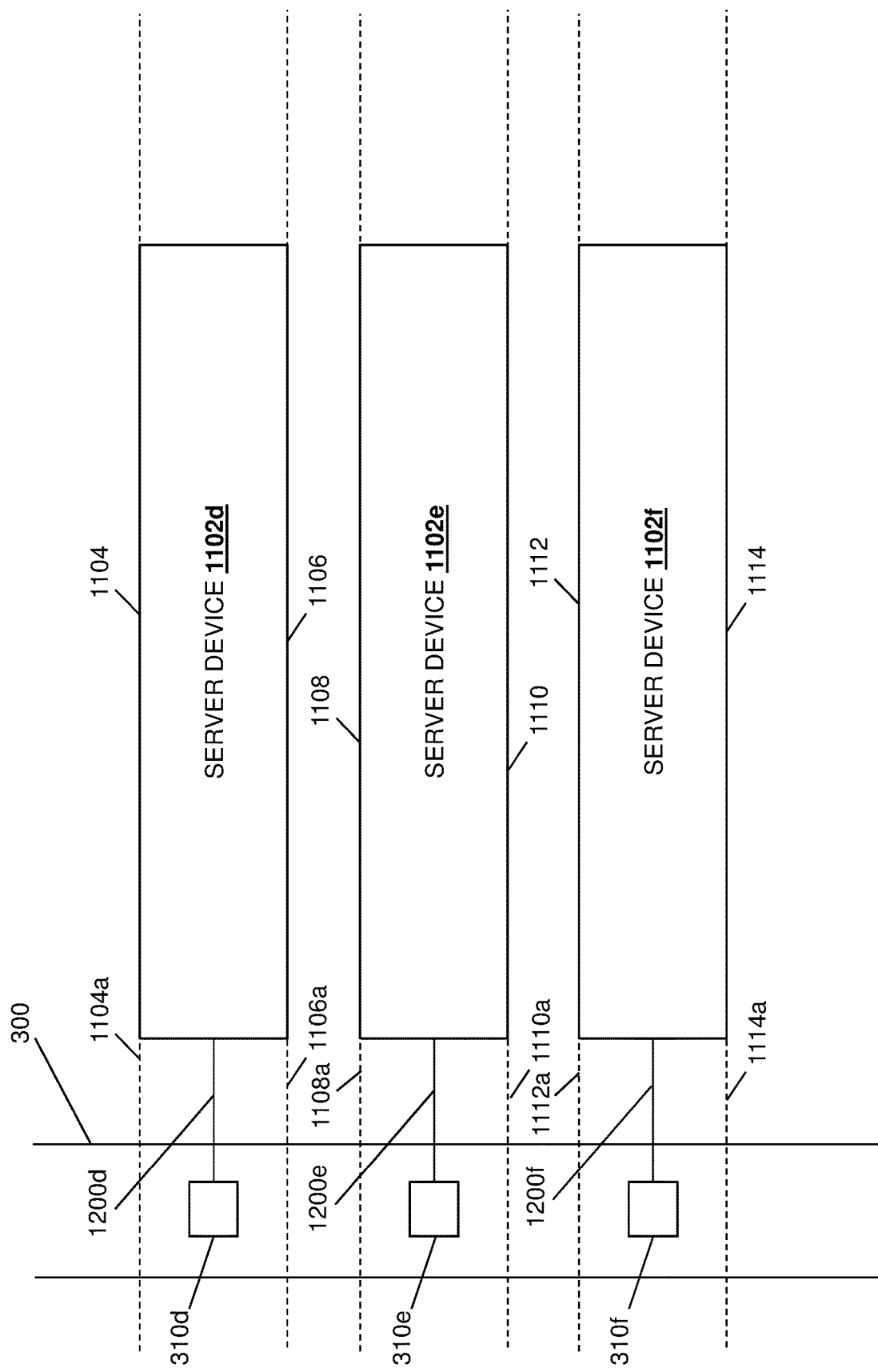
FIG. 12B is a schematic view illustrating an embodiment of some of the ports on the switch system of FIG. 11A coupled to respective server devices provided in the rack of FIG. 12A.

Similarly as described above, the method 1000 then proceeds to block 1004 where respective cables are connected to each port on the switch system and the respective computing device located adjacent that port. In an embodiment, at block 1004, a cable may be connected to each port on the switch system 1300 and the respective server device located adjacent that port. Similarly as illustrated in FIGS. 12A and 12B, respective cables may be connected to each of the first ports 1308a-1308f and second ports 1312a-1312l on the switch system 1300 and the respective server device 1102a-1102n in the rack 1100 located adjacent that port. As will be appreciated by one of skill in the art in possession of the present disclosure, embodiments of the rack switch coupling system described above allows for the coupling of the server devices 1102a-1102n to the switch system 1300 via a plurality of relatively short, equal length cables 1200a-1200n that do not need to be routed along the height of the rack 1100 to the switch system 300, or bundled together as part of their routing to the switch system 1300. As such, one of skill in the art in possession of the present disclosure will appreciate that the airflow issues, server device addition/removal issues from the rack, server device/switch system connection tracing issues, and/or other issues associated with conventional rack switch coupling systems are reduced and/or substantially eliminated.

Similarly as described above, the method 1000 then proceeds to block 1006 where data is transmitted via each respective cable. In an embodiment, at block 1006, the processing system 1306 in the switch system 1300 may operate to transmit data via the cables with the respective server devices 1102a-1102n while performing any of a variety of conventional switching operations that would be apparent to one of skill in the art in possession of the present disclosure. As such, the switch system 1300 may utilize the components of the switch system 1400 discussed above to receive electrical signals from a server device via the second port 1408, transmit those electrical signals via the cable 1412 and the trace 1416, and process those electrical signals using the processing system 1406 as part of the data transmission operations at block 1006. Similarly, the switch system 1300 may utilize the components of the switch system 1500 discussed above to receive optical signals from a server device via the second port 1408, convert those optical signals to electrical signals using the transceiver 1511, transmit those electrical signals via the cable 1512 and the trace 1516, and process those electrical signals using the processing system 1506 as part of the data transmission operations at block 1006.

Similarly as well, the switch system 1300 may utilize the components of the switch system 1600 discussed above to receive optical signals from a server device via the second port 1408, transmit those optical signals via the cable 1612, convert those optical signals to electrical signals using the transceiver 1613, transmit those electrical signals via the trace 1616, and process those electrical signals using the processing system 1606 as part of the data transmission operations at block 1006. Furthermore, one of skill in the art in possession of the present disclosure will appreciate how, in any of the embodiments above, the data transmission performed at block 1006 by the switch device 1300 may include receiving signals from the first ports 1308a-1308l and transmitting those signals via the respective traces 1310a-1310f using a variety of conventional signal transmission techniques known in the art. However, while a few specific examples have been provided, one of skill in the art in possession of the present disclosure will appreciate that the data transmission performed at block 1006 may include a variety of other operations that will fall within the scope of the present disclosure as well.

Thus, systems and methods have been described that provide a switch system that extends at least partially along the height of a rack, with ports on that switch system located adjacent each computing device in that rack, allowing for cabling that eliminates the need for any substantial cable routing of the cables between those computing devices and ports and the issues associated with such cable routing. For example, a switch system positioned in a rack may include a circuit board with a processing system. Respective first ports on the switch system are each located on the circuit board, each coupled to the processing system via a respective trace on the circuit board, and each cabled to a respective one of the plurality of computing devices, with each respective first port is located adjacent the computing device to which it is cabled and between the first plane and the second plane associated with that computing device. Respective second ports on the switch system are each located off of the circuit board, each coupled to the processing system via a respective trace on the circuit board and a respective cable extending between that trace and that second port, and each cabled to a respective one of the plurality of computing devices, with each respective second port is located adjacent the computing device to which it is cabled and between the first plane and the second plane associated with that computing device.

As will be appreciated by one of skill in the art in possession of the present disclosure, the switch system of the present disclosure frees up space in racks for housing computing devices that has traditionally be utilized for housing switch devices, allows for more cost efficient and easier to install cabling, reduces the amount of time need to add/remove cabling, provides for easier tracing and troubleshooting of cabled ports, reduces the blockage of airflow in the rack introduced by conventional cable routing techniques, reduces the blocking of device status indicators/LEDs introduced by conventional cable routing techniques, reduces the blocking of text on devices that is introduced by conventional cable routing techniques, minimizes cabling mistakes (e.g., the connection of a cable to or removal of a cable from the wrong port), reduces or eliminates the need for cable management systems/hardware, provides for a neater/more organized rack appearance, may be optimized for storing the cables utilized in the rack, narrows the variation in cable lengths utilized with the rack to reduce complexity in cable ordering, and/or provides a variety of other benefits that would be apparent to one of skill in the art in possession of the present disclosure.

As would be appreciated by one of skill in the art in possession of the present disclosure, the switch systems discussed above provide for the complete replacement of conventional switch devices (e.g., TOR switch devices) in a rack. However, the inventors of the present disclosure appreciate that network administrators and/or other users of racks (e.g., similar to the rack 202 discussed above) may wish to utilize their conventional switch devices while still experiencing the benefits of the present disclosure and, as such, the inventors of the presented disclosure have developed a port extender system that may be provided in a rack with conventional switch device(s) and server devices to provide many of the same benefits discussed above.

Figure 17A:
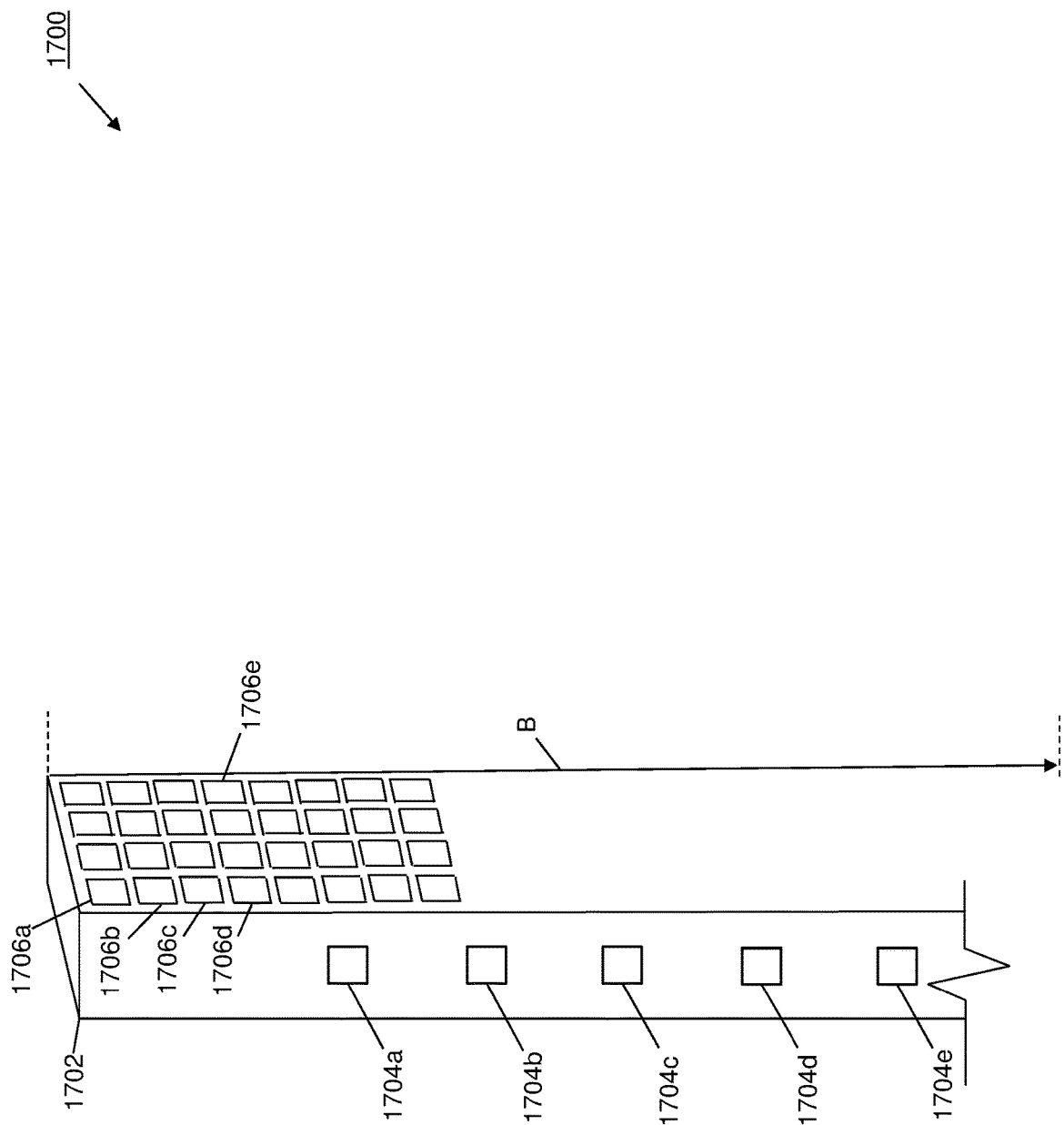
FIG. 17A is a schematic view illustrating an embodiment of a port extender system that may provide the rack switch coupling system of the present disclosure.
Figure 17B:
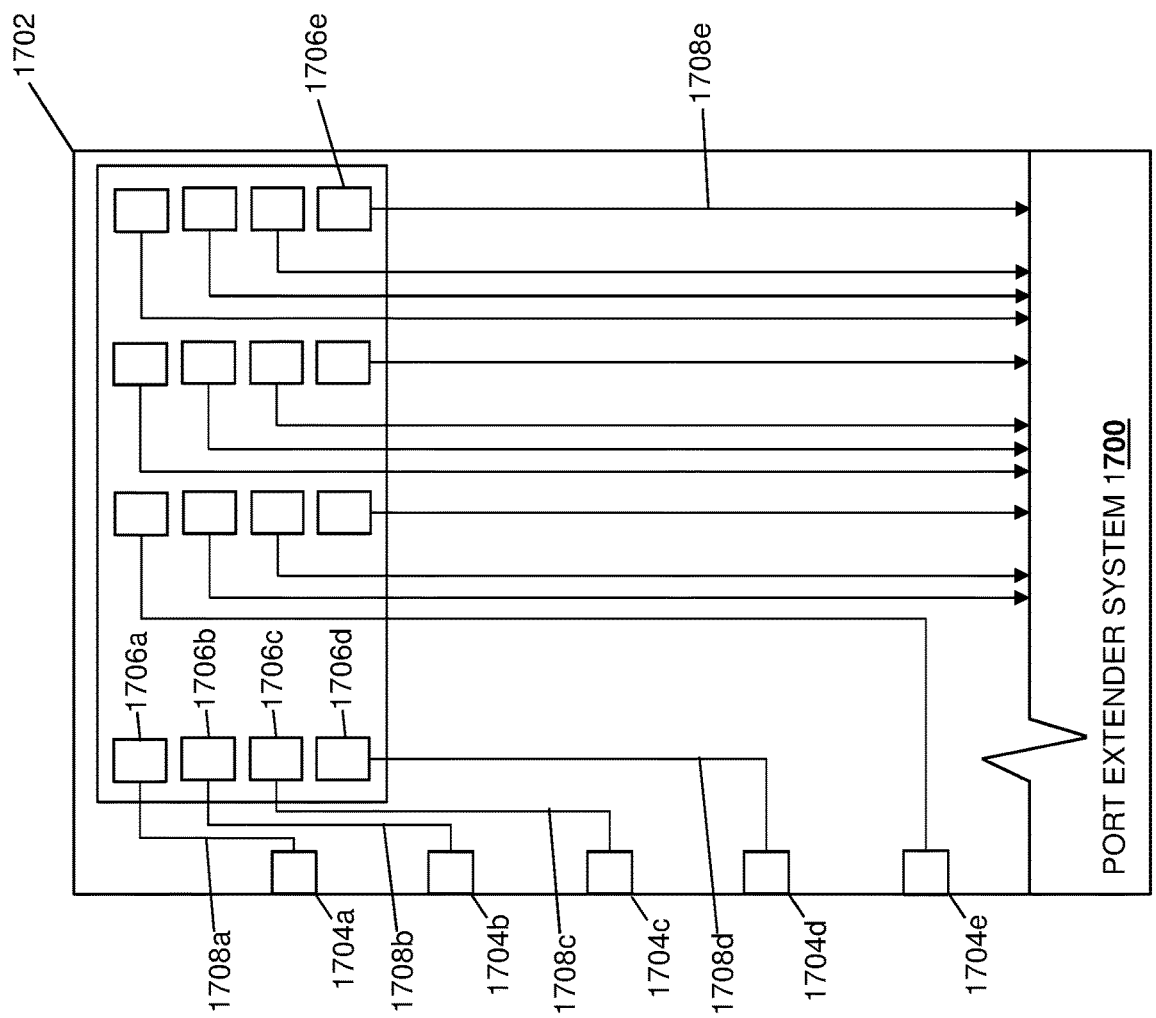
FIG. 17B is a schematic view illustrating an embodiment of the port extender system of FIG. 17A.

Referring now to FIGS. 17A and 17B, an embodiment of a port extender system 1700 is illustrated that may provide the rack switch coupling system of the present disclosure. As such, the port extender system 1700 may be provided as part of the IHS 100 discussed above with reference to FIG. 1 and/or may include some or all of the components of the IHS 100, and in specific examples, may provide any of a variety of pass-through communication subsystem functionality that would be apparent to one of skill in the art in possession of the present disclosure. However, while illustrated and discussed as a port extender system providing pass-through communication subsystem functionality, one of skill in the art in possession of the present disclosure will recognize that the functionality of the port extender system 1700 discussed below may be provided by other devices that are configured to operate similarly as the port extender system 1700 discussed below. In the illustrated embodiment, the port extender system 1700 includes a chassis 1702 that houses or supports the components of the port extender system 1700, only some of which are illustrated and discussed below. In some examples, the chassis 1702 may include a plurality of chassis walls that define a chassis enclosure that houses the components of the port extender system 1700. However, in other examples, the chassis 1702 may include a circuit board (e.g., a motherboard) that supports the components of the port extender system 1700. Furthermore, similarly as discussed for the switch systems above, the chassis 1702 may include structures that support modular port extender devices that include the components of the port extender system 1700. As such, one of skill in the art in possession of the present disclosure will appreciate that the chassis 1702 of the port extender system 1700 may be provided in a variety of manners that will fall within the scope of the present disclosure as well.

The chassis 1702 may house or support a communication system that may include a variety of communication components, only some of which are illustrated in FIGS. 17A and 17B. In the illustrated embodiments, the communication system may include the plurality of server ports 1704a, 1704b, 1704c, 1704d, and 1704e, and one of skill in the art in possession of the present disclosure will appreciate that the communication system in the port extender system 1700 may include any number of server ports in order to provide respective connections to respective server devices in a rack, discussed below. As illustrated in FIG. 17A, the server ports 1704a-1704e may be positioned along a height B of the chassis 1702 in a spaced-apart, stacked orientation relative to each other, with the height B provided as approximately equal to the height of a rack (e.g., the rack 202 illustrated in FIG. 2) in which the port extender system 1700 will be used, and the spacing and location of the ports 1704a-1704e provided such that each respective port is located adjacent a corresponding server device in the rack in which the port extender system 1700 will be used. However, similarly as described for the switch systems above, the port extender system 1700 illustrated in FIGS. 17A and 17B may include a chassis that extends only along a portion of a height the rack in which it will be used (e.g., along half of the height of that rack, along one-third of the height of that rack, along a quarter of the height of that rack, etc.) while remaining with the scope of the present disclosure as well.

In the illustrated embodiment, the communication system may include a plurality of switch ports including the switch ports 1706a, 1706b, 1706c, 1706d, and 1706e that are identified by element numbers in FIG. 17A, and one of skill in the art in possession of the present disclosure will appreciate that the communication system in the port extender system 1700 may include any number of switch ports in order to provide respective connections to a switch device in a rack for each server device in that rack, discussed below. As illustrated in FIG. 17A, the switch ports 1706a-1706e may be positioned adjacent a top portion of the chassis 1702 and oriented in a switch port matrix (e.g., a 4×8 rectangular matrix in the illustrated embodiment), with the switch port matrix positioned on the chassis 1702 in order to provide it in a location that will be adjacent switch device(s) in a rack when the port extender system 1700 is positioned in that rack. As such, one of skill in the art in possession of the present disclosure will appreciate that the port extender system 1700 illustrated in FIGS. 17A and 17B may include switch ports at any location along the height of the chassis 1700 that may depend on the corresponding location of the switch device(s) in the rack in which it will be used.

As illustrated in FIG. 17B, each of the server ports 1704a-1704e may be coupled to a respective one of the switch ports 1706a-1706e by a respective connection. For example, in the illustrated embodiment, a connection 1708a is provided between the server port 1704a and the switch port 1706a in order to allow for the transmission of data traffic between the server port 1704a and the switch port 1706a, a connection 1708b is provided between the server port 1704b and the switch port 1706b in order to allow for the transmission of data traffic between the server port 1704b and the switch port 1706b, a connection 1708c is provided between the server port 1704c and the switch port 1706c in order to transmit data traffic between the server port 1704c and the switch port 1706c, a connection 1708d is provided between the server port 1704d and the switch port 1706d in order to transmit data traffic between the server port 1704d and the switch port 1706d, and a connection 1708e is provided between the server port 1704e and a switch port (not illustrated in FIGS. 17A and 17B) in order to transmit data traffic between the server port 1704e and that switch port 1706e. As such, as will be appreciated by one of skill in the art in possession of the present disclosure, a respective connection may be provided between any server port and switch port on the port extender system 1700.

In some examples, the server ports 1704a-1704e and switch ports 1706a-1706e may be provided by Ethernet ports, and thus the connections 1708a-1708e may be provided by electrical (e.g., copper) cabling and/or traces that extends between each respective server port and switch port combination, similarly as discussed above with regard to FIGS. 13, 14, 15, and 16 and the switch systems 1300, 1400, 1500, and 1600. In other examples, the server ports 1704a-1704e and switch ports 1706a-1706e may be provided by optical ports, and thus the connections 1708a-1708e may be provided by optical (e.g., fiber optic) cabling and/or waveguides that extend between each respective server port and switch port combination, similarly as discussed above with regard to FIGS. 7, 8, and 9, and the switch systems 700, 800, and 900. Furthermore, combinations of Ethernet and optical ports may be provided on the port extender system 1700, and thus respective electrical (e.g., copper) cabling and/or traces and optical (e.g., fiber optic) cabling and/or waveguides may extend between each Ethernet server/switch port combinations and optical server/switch port combinations, respectively. However, while specific server and switch ports, and the connections between them, have been described, one of skill in the art in possession of the present disclosure will appreciated that any of a variety of server and switch ports may be provided on the port extender system 1700 and connected via appropriate connections while remaining within the scope of the present disclosure as well.

In a specific example, the teachings above provided for the port extender system 1700 and the switch systems 1300, 1400, 1500, and/or 1600 may be combined to provide the connections between the server ports 1704a-1704e and the switch ports 1706a-1706e along with some processing functionality (e.g., via a processing system similar to the processing system 1306 illustrated in FIG. 13.) As will be appreciated by one of skill in the art in possession of the present disclosure, processing functionality provided with the port extender system 1700 may enable feature such as, for example, the ability to program the connectivity between different server ports 1704a-1704e and the switch ports 1706a-1706e in order to, for example, change which server ports 1704a-1704e transmit data to which switch ports 1706a-1706e on the port extender system 1700, as well as any other functionality that would be apparent to one of skill in the art in possession of the present disclosure.

In some embodiments, a respective identifier identifying the respective server port connected to each of the plurality of switch ports may be provided on the chassis 1702. For example, an identifier for the server port 1704a may be printed on the chassis 1702 immediately adjacent the switch port 1706a in order to indicate to a user of the port extender system 1700 that a server device connected to the server port 1704a may be connected to a switch device via the switch port 1706a, an identifier for the server port 1704b may be printed on the chassis 1702 immediately adjacent the switch port 1706b in order to indicate to a user of the port extender system 1700 that a server device connected to the server port 1704b may be connected to a switch device via the switch port 1706b, an identifier for the server port 1704c may be printed on the chassis 1702 immediately adjacent the switch port 1706c in order to indicate to a user of the port extender system 1700 that a server device connected to the server port 1704c may be connected to a switch device via the switch port 1706c, an identifier for the server port 1704d may be printed on the chassis 1702 immediately adjacent the switch port 1706d in order to indicate to a user of the port extender system 1700 that a server device connected to the server port 1704d may be connected to a switch device via the switch port 1706d, and so on.

However, while specific identifiers have been identified as being printed on the chassis 1702a, one of skill in the art in possession of the present disclosure will appreciated that the connection between respective server and switch ports may be identified in a variety of manners that will fall within the scope of the present disclosure as well. Furthermore, while a specific port extender system 1700 has been illustrated, one of skill in the art in possession of the present disclosure will recognize that port extender systems (or other devices and/or systems operating according to the teachings of the present disclosure in a manner similar to that described below for the port extender system 1700) may include a variety of components and/or component configurations for providing conventional port extender functionality, as well as the functionality discussed below, while remaining within the scope of the present disclosure as well.

Figure 18:
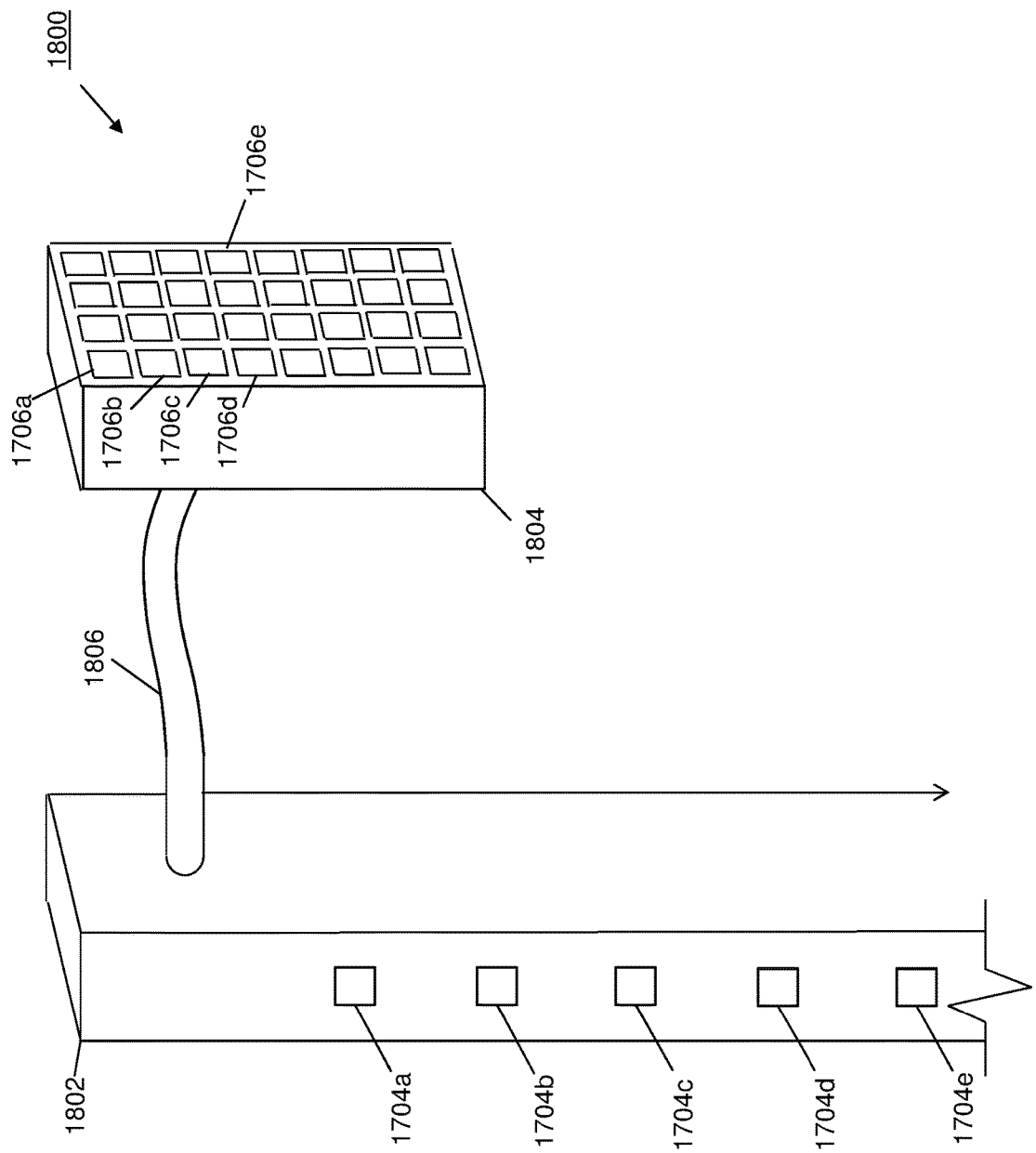
FIG. 18 is a schematic view illustrating an embodiment of a port extender system that may provide the rack switch coupling system of the present disclosure.

For example, FIG. 18 illustrates a port extender system 1800 that is similar to the port extender system 1700 discussed above with reference to FIGS. 17A and 17B and, as such, includes similar elements numbers for similar features. However, the port extender system 1800 provides a first chassis 1802 including the server ports 1704a-1704e, along with a second chassis 1804 that includes the switch ports 1706a-1706e and that is coupled to the first chassis 1802 by a cable 1806. As will be appreciated by one of skill in the art in possession of the present disclosure, the cable 1806 may house and/or provide the connections 1708a-1708e between the server ports 1704a-1704e and the switch ports 1706a-1706e discussed above with reference to FIGS. 17A and 17B. As discussed in further detail below, while a specific cabling of the first chassis 1802 to the second chassis 1804 is illustrated, the second chassis 1804 may be coupled to the first chassis 1802 at any location and in any manner that allows the location of the switch ports 1706a-1706e to be moved relative to the first chassis 1802 in order to provide for the positioning of the switch ports 1706a-1706e in different locations relative to a rack (and adjacent switch device(s) in that rack) when the first chassis 1802 is located in the rack. As such, a variety of configurations that provide for relative movement of the server ports 1704a-1704e and the switch ports 1706a-1706e is envisioned as falling within the scope of the present disclosure.

As will be appreciated by one of skill in the art in possession of the present disclosure, the port extender system of the present disclosure may be provided in racks that can exceed six feet in height, and thus the physical distance between any server port and switch port in the port extender system may be several feet. As such, signal integrity issues may exist if signals are transmitted within the port extender system using traditional port coupling methods (e.g., traces on a motherboard), particular with regard to signals transmitted between the ports that are furthest from each other, and the use of cable/port coupling techniques described above may be provided in order to couple server ports to switch ports in the port extender system.

However, in some embodiments, the port extender system of the present disclosure may be provided with a motherboard and traces coupling at least some of its server ports that are included on the motherboard to switch ports that are included on the motherboard at a distance that is close enough so as to not introduce signal integrity issues when a trace is used to transmit signals over that distance, while the cable/port coupling techniques discussed above may be utilized to couple server ports and switch ports that are separated by a distance such that motherboard traces alone are not a coupling option. However, in some embodiments, the cable/port coupling techniques described herein may couple all of the server ports and switch ports on the port extender system while remaining within the scope of the present disclosure as well. Further still, one of skill in the art in possession of the present disclosure will appreciate that respective cables may be provided for each server port/switch port connection described above with respect to the switch system 1300, or a single cable may be provided for multiple server port/switch port connections (e.g., while using the modulation similar to that described above to distinguish signals that are to be provided for different ports.) As such, a wide variety of modification and combination of the embodiments discussed above is envisioned as falling within the scope of the present disclosure.

Figure 19:
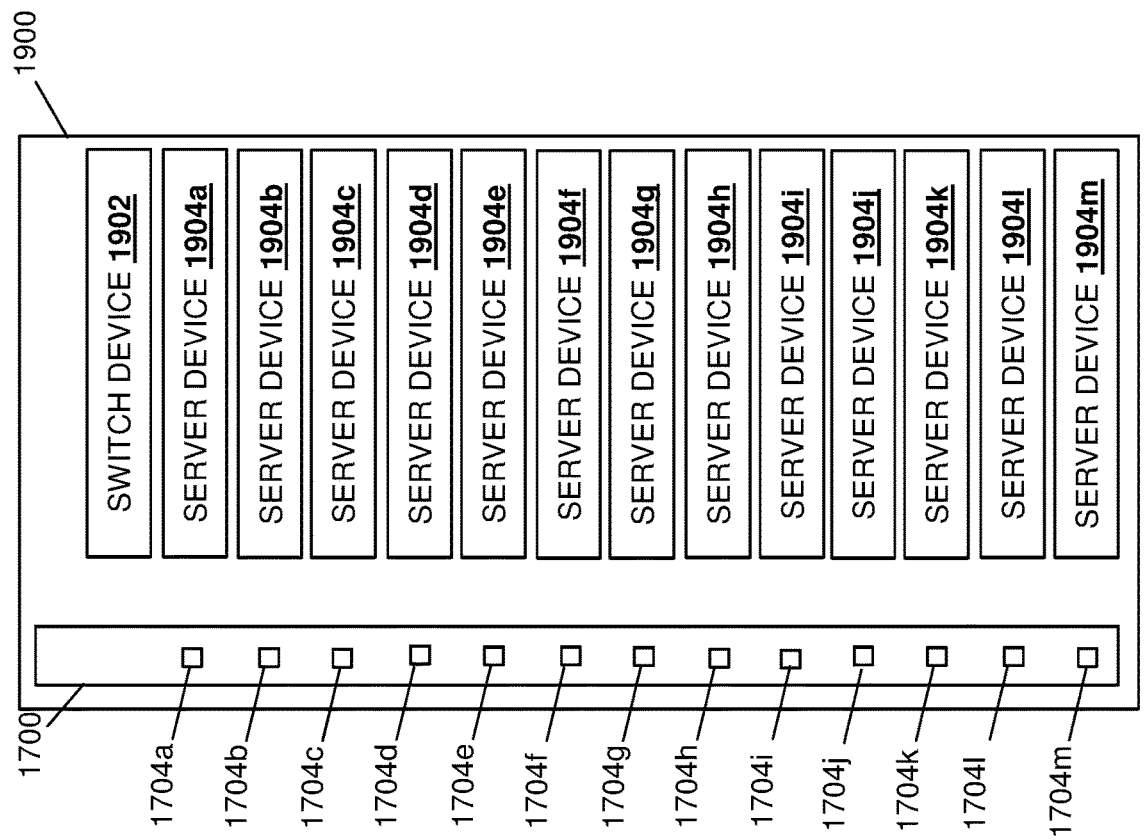
FIG. 19 is a schematic view illustrating an embodiment of the port extender system of FIGS. 17A and 17B located in a rack during the method of FIG. 10 to provide the rack switch coupling system of the present disclosure.

Referring back to FIG. 10, an embodiment of a method 1000 for coupling a switch device in a rack may utilize the port extender system 1700 discussed above. Similarly as discussed above, the method 1000 may begin at block 1002 and a switch system that includes a switch device and a port extender system may be provided in a rack with computing devices such that each server port on the port extender system is located adjacent a respective computing device and between first and second planes corresponding to that computing device. In an embodiment, at block 1002, the port extender system 1700 discussed above with reference to FIGS. 17A and 17B may be provided in a rack including a switch device and plurality of computing devices. For example, FIG. 19 illustrates an embodiment of a rack 1900 that includes a switch device 1902 (e.g., a TOR switch device) and a plurality of server devices 1904a-1904m, and in different examples, may be provided by conventional racks or newer rack designs that are being developed (e.g., NetShelter SX series racks available from Schneider Electric of Rueil-Malmaison, France) to provide additional space (both front-to-back and side-to-side) in the rack, offering up to 1200 millimeters of depth and/or up to 750 millimeters of width, and one of skill in the art in possession of the present disclosure will appreciate how the port extender system of the present disclosure may be designed to fit in any such racks. Furthermore, while only one switch device 1902 is illustrated as included in the rack 1900, one of skill in the art in possession of the present disclosure will appreciate that multiple switch devices may be provided in the rack 1900 while remaining within the scope of the present disclosure as well.

As illustrated in FIG. 1, the switch device 1902 may be provided in the rack 1900 adjacent (i.e., above) the server device 1904a, and the port extender system 1700 may be provided in the rack 1900 and span the entire height of the rack 1900, with the switch ports 1706a-1706e (not visible in FIG. 15) located adjacent the switch device 1902, and each of the server ports 1704a-1704m on the port extender system 1700 located adjacent a respective server device 1904a-1904m. As will be appreciated by one of skill in the art in possession of the present disclosure, in embodiments in which the switch ports 1706a-1706e are integrated into port extender system 1700 (as illustrated in FIGS. 17A and 17B), those switch ports 1706a-1706e may be positioned adjacent the switch device 1902 based on knowledge of the position of the switch device 1902 in the rack 1900, or by moving the switch device 1902 in the rack 1900 such that it is adjacent the location of the switch ports 1706a-1706e on the port extender system 1700 when that port extender system 1700 is located in the rack 1900. However, in other embodiments such as that illustrated in FIG. 18, the location of the switch ports 1706a-1706 e may be moved (e.g., via movement of the second chassis 1804) to a location on the rack 1900 that is adjacent the switch device 1902, and one of skill in the art in possession of the present disclosure will appreciate that such embodiments allow the switch ports 1706a-1706e to be provided in any location within or outside the rack 1900 to provide them adjacent to the switch device 1902 while remaining within the scope of the present disclosure.

As such, in some embodiments, the server ports 1704a-1704m on the port extender system 1700 being located adjacent a respective server device 1904a-1904m in the rack 1900 may include each of those ports being located between the top and bottom planes for that respective server device. Similarly as illustrated in FIG. 11B for the ports 310d, 310e, and 310f on the switch system 300, the server port 104f on the port extender system 1700 may be located between a top plane and a bottom plane (i.e., similar to the top plane 1104a and the bottom plane 1106a on the server device 1102d illustrated in FIG. 11B) for the server device 1904f, the server port 1704g on the port extender system 1700 may be located between a top plane and a bottom plane (i.e., similar to the top plane 1108a and the bottom plane 1110a on the server device 1102e illustrated in FIG. 11B) for the server device 1904g, and the server port 1704h on the port extender system 1700 may be located between a top plane and a bottom plane (i.e., similar to the top plane 1112a and the bottom plane 1114a on the server device 1102f illustrated in FIG. 11B) for the server device 1904h, and one of skill in the art in possession of the present disclosure will appreciate that the remaining server ports on the port extender system 1700 may be located adjacent their respective server devices in the rack 1900 in a similar manner as well. However, while the adjacency of the server ports and their respective computing devices is described herein based on top and bottom planes associated with those computing devices, one of skill in the art in possession of the present disclosure will appreciate that server port/computing device adjacency that provides the benefits of the present disclosure may be defined in a variety of other manners that will fall within the scope of the present disclosure as well.

Figure 20:
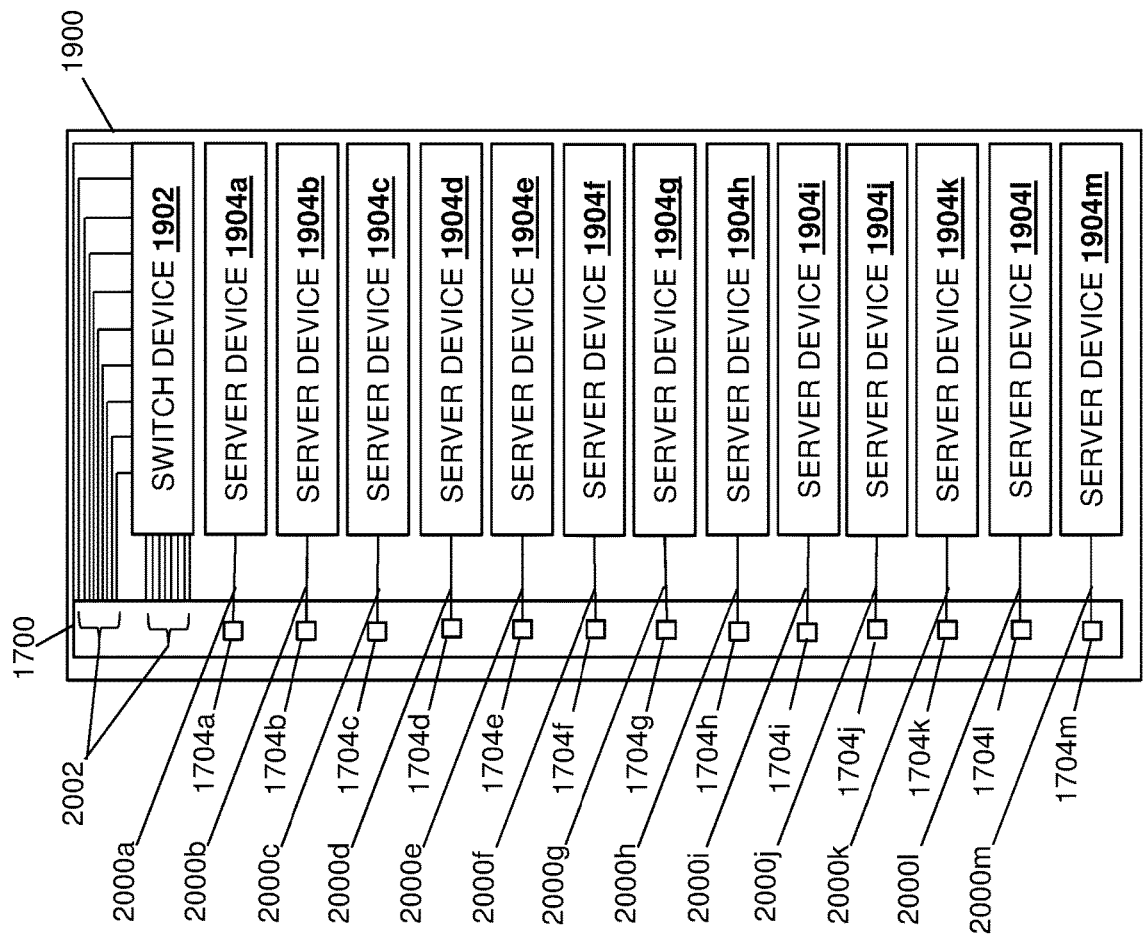
FIG. 20 is a schematic view illustrating an embodiment of the port extender system of FIGS. 17A and 17B coupled to server devices and a switch device in a rack during the method of FIG. 10.

Similarly as described above, the method 1000 then proceeds to block 1004 where respective cables are connected to each server port on the port extender system and the respective computing device located adjacent that server port, as well as between each switch port on the port extender system and the switch device. In an embodiment, at block 1004, a cable may be connected to each server port on the port extender system 1700 and the respective server device located adjacent that port. For example, as illustrated in FIG. 20, a cable 2000a is provided connected to each of the server port 1704a and a port on its adjacent server device 1904a, a cable 2000b is provided connected to each of the server port 1704b and a port on its adjacent server device 1904b, a cable 2000c is provided connected to each of the server port 1704c and a port on its adjacent server device 1904c, a cable 2000d is provided connected to each of the server port 1704d and a port on its adjacent server device 1904d, a cable 2000e is provided connected to each of the server port 1704e and a port on its adjacent server device 1904e, a cable 2000f is provided connected to each of the server port 1704f and a port on its adjacent server device 1904f, a cable 2000g is provided connected to each of the server port 1704g and a port on its adjacent server device 1904g, a cable 2000h is provided connected to each of the server port 1704h and a port on its adjacent server device 1904h, a cable 2000i is provided connected to each of the server port 1704i and a port on its adjacent server device 1904i, a cable 2000j is provided connected to each of the server port 1704j and a port on its adjacent server device 1904j, a cable 2000k is provided connected to each of the server port 1704k and a port on its adjacent server device 1904k, a cable 2000l is provided connected to each of the server port 1704l and a port on its adjacent server device 1904l, and a cable 2000m is provided connected to each of the server port 1704m and a port on its adjacent server device 1904m.

Furthermore, at block 1004, each of a plurality of cables 2002 may be connected to a respective switch port on the port extender system 1700 and a port on the switch device 1902. As will be appreciated by one of skill in the art in possession of the present disclosure, embodiments of the rack switch coupling system described above allows for the coupling of the server devices 1904a-1904m to the port extender system 1700 via a plurality of relatively short, equal length cables 2000a-2000m that do not need to be routed along the height of the rack 1900 to the switch device 1902, or bundled together as part of their routing to the switch device 1902. As such, one of skill in the art in possession of the present disclosure will appreciate that the airflow issues, server device addition/removal issues from the rack, server device/switch system connection tracing issues, and/or other issues associated with conventional rack switch coupling systems are reduced and/or substantially eliminated.

Similarly as described above, the method 1000 then proceeds to block 1006 where data is transmitted via each respective cable. In an embodiment, at block 1006, the port extender system 1700 may operate to transmit data via the cables 2000a-2000m connected to the respective server devices 1904a-1904m and the cables 2002 connected to the switch device 1902 to allow data to be exchanged between the switch device 1902 and the server devices 1904a-1904m. As such, the port extender system 1700 may utilize the connections 1708a-1708e between its server ports 1704a-1704e and switch ports 1706a-1706e in order to transmit data between the switch device 1902 and the server devices 1904a-1904m. However, while a few specific examples have been provided, one of skill in the art in possession of the present disclosure will appreciate that the data transmission performed at block 1006 may include a variety of other operations that will fall within the scope of the present disclosure as well.

Thus, systems and methods have been described that provide a port extender system that extends at least partially along the height of a rack, with server ports on that port extender system that are located adjacent each computing device in that rack, and that are connected to switch ports on that port extender system that are located adjacent switch device(s) in that rack, allowing for cabling that eliminates the need for any substantial cable routing of the cables between those computing devices and that switch device, and the issues associated with such cable routing. For example a port extender system may include respective first ports cabled to each of a plurality of server devices in a rack, with each of the respective first ports located adjacent the server device to which it is cabled and between a top plane and a bottom plane associated with that server device, and a plurality of second ports that are each located adjacent to a switch device and cabled to the switch device, wherein each respective first port is connected to one of the plurality of second ports. As will be appreciated by one of skill in the art in possession of the present disclosure, the port extender system of the present disclosure allows for more cost efficient and easier to install cabling, reduces the amount of time need to add/remove cabling, provides for easier tracing and troubleshooting of cabled ports, reduces the blockage of airflow in the rack introduced by conventional cable routing techniques, reduces the blocking of device status indicators/LEDs introduced by conventional cable routing techniques, reduces the blocking of text on devices that is introduced by conventional cable routing techniques, minimizes cabling mistakes (e.g., the connection of a cable to or removal of a cable from the wrong port), reduces or eliminates the need for cable management systems/hardware, provides for a neater/more organized rack appearance, may be optimized for storing the cables utilized in the rack, narrows the variation in cable lengths utilized with the rack to reduce complexity in cable ordering, and/or provides a variety of other benefits that would be apparent to one of skill in the art in possession of the present disclosure.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A rack switch coupling system, comprising:
   a rack;
   a switch device that is positioned in the rack;
   a plurality of computing devices that are positioned in the rack in a stacked orientation, wherein each of the plurality of computing devices includes:
      a top surface that corresponds with a first plane associated with that computing device; and
      a bottom surface that is located opposite that computing device from the top surface and that corresponds with a second plane associated with that computing device; and
   a port extender system that is positioned in the rack and that includes:
      respective first ports cabled to each of the plurality of computing devices, wherein each of the respective first ports is located adjacent the computing device to which it is cabled and between the first plane and the second plane associated with that computing device; and
      a plurality of second ports that are each located adjacent to the switch device and cabled via a respective cable to the switch device, wherein each respective first port is connected to one of the plurality of second ports such that each of the plurality of computing devices may transmit data to the switch device via the first port cabled to that computing device, the connection of that first port to the respective second port, and the cabling of that respective second port to the switch device via the respective cable.

2. The system of claim 1, wherein the port extender system includes a chassis that extends along a height of the rack and adjacent each of the plurality of computing devices that are positioned in the rack.

3. The system of claim 1, wherein the respective first ports are located on a first chassis, and wherein the plurality of second ports are located on a second chassis that is cabled to the first chassis.

4. The system of claim 1, wherein the plurality of second ports are oriented in a second port matrix.

5. The system of claim 1, wherein the port extender system includes:
   a respective identifier identifying the respective first port connected to each of the plurality of second ports.

6. The system of claim 1, wherein the port extender system includes:
   a respective cable extending between the respective first port connected to each of the plurality of second ports.

7. An Information Handling System (IHS), comprising:
   at least one chassis is configured to be positioned in a rack including a switch device and a plurality of computing devices in a stacked orientation; and
   a communication system that is located in the at least one chassis and that includes:
      respective first ports that are each configured to be cabled to the plurality of computing devices when the at least one chassis is positioned in the rack, with each of the respective first ports located adjacent the computing device to which it is cabled and between a first plane corresponding to a top surface of that computing device and a second plane corresponding to a bottom surface of that computing device that is opposite the top surface; and
      a plurality of second ports that are each configured to each be located adjacent to the switch device and cabled via a respective cable to the switch device when the at least one chassis is positioned in the rack, wherein each respective first port is connected to one of the plurality of second ports such that each of the plurality of computing devices may transmit data to the switch device via a first port cabled to that computing device, the connection of that first port to a respective second port, and the cabling of that respective second port to the switch device via a respective cable.

8. The IHS of claim 7, wherein the at least one chassis includes a chassis that extends along a height of the rack and adjacent each of the plurality of computing devices that are positioned in the rack.

9. The IHS of claim 7, wherein the respective first ports are located on a first chassis that is included in the at least one chassis, and wherein the plurality of second ports are located on a second chassis that is included in the at least one chassis and that is cabled to the first chassis.

10. The IHS of claim 9, wherein the first chassis is housed in the rack, and wherein the second chassis is located outside the rack.

11. The IHS of claim 7, wherein the plurality of second ports are oriented in a second port matrix.

12. The IHS of claim 7, further comprising:
a respective identifier that is included on the at least one chassis and that identifies the respective first port connected to each of the plurality of second ports.

13. The IHS of claim 7, further comprising:
a respective cable extending between the respective first port connected to each of the plurality of second ports.

14. A method for coupling a switch device in a rack, comprising:
providing a port extender system in a rack including a switch device and a plurality of computing devices in a computing device stacked orientation, wherein the port extender system includes:
respective first ports in a first port stacked orientation, wherein each of the respective first ports is located adjacent a respective computing device included in the plurality of computing device and between a first plane corresponding to a top surface of that respective computing device and a second plane corresponding to a bottom surface of that respective computing device that is opposite the top surface; and
a plurality of second ports that are each located adjacent to the switch device and cabled via a respective cable to the switch device, wherein each respective first port is connected to one of the plurality of second ports;
connecting a respective port/computing device cable to each respective first port and the computing device located adjacent that respective first port; and
transmitting, by each of the plurality of computing devices, data via the respective port/computing device cable that cables that computing device to the respective first port, the connection of that first port to the respective second port, and the respective cable that cables that respective second port to the switch device.

15. The method of claim 14, wherein the port extender system includes a chassis that extends along a height of the rack and adjacent each of the plurality of computing devices that are positioned in the rack.

16. The method of claim 14, wherein the respective first ports are located on a first chassis, and wherein the plurality of second ports are located on a second chassis that is cabled to the first chassis.

17. The method of claim 16, wherein the first chassis is housed in the rack, and wherein the second chassis is located outside the rack.

18. The method of claim 14, wherein the plurality of second ports are oriented in a second port matrix.

19. The method of claim 14, wherein a respective identifier is included the port extender system and identifies the respective first port connected to each of the plurality of second ports.

20. The method of claim 14, wherein a respective port/port cable extends between the respective first port connected to each of the plurality of second ports.

* * * * *